(12) United States Patent
Lee et al.

(10) Patent No.: US 8,847,342 B2
(45) Date of Patent: Sep. 30, 2014

(54) MAGNETIC DEVICE AND METHOD OF MANUFACTURING THE SAME

(75) Inventors: Woo-cheol Lee, Suwon-si (KR);
Tokashiki Ken, Seongnam-si (KR);
Hyung-joon Kwon, Seongnam-si (KR);
Myung-hoon Jung, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/600,422

(22) Filed: Aug. 31, 2012

(65) Prior Publication Data
US 2013/0146997 A1 Jun. 13, 2013

(30) Foreign Application Priority Data
Dec. 7, 2011 (KR) .................. 10-2011-0130474

(51) Int. Cl.
*H01L 27/22* (2006.01)
(52) U.S. Cl.
USPC .......... 257/427; 257/295; 257/314; 257/421; 257/425

(58) Field of Classification Search
None
See application file for complete search history.

(56) References Cited

U.S. PATENT DOCUMENTS

| | | | | |
|---|---|---|---|---|
| 7,221,584 B2* | 5/2007 | Liu et al. | .......... | 365/158 |
| 2003/0219984 A1* | 11/2003 | Ying et al. | .......... | 438/709 |
| 2010/0237042 A1* | 9/2010 | Nguyen et al. | .......... | 216/22 |
| 2010/0304504 A1* | 12/2010 | Shinde et al. | .......... | 438/3 |

FOREIGN PATENT DOCUMENTS

| | | |
|---|---|---|
| JP | 2006-060172 A | 3/2006 |
| JP | 2011-014881 A | 1/2011 |
| KR | 10-2004-0069061 A | 8/2004 |

* cited by examiner

*Primary Examiner* — Kyoung Lee
(74) *Attorney, Agent, or Firm* — Lee & Morse, P.C.

(57) ABSTRACT

A method of manufacturing a magnetic device includes forming a stack structure, the stack structure including a magnetic layer, and etching the stack structure by using an etching gas, the etching gas including at least 80% by volume of $H_2$ gas.

14 Claims, 22 Drawing Sheets

US 8,847,342 B2

MAGNETIC DEVICE AND METHOD OF MANUFACTURING THE SAME

CROSS-REFERENCE TO RELATED APPLICATIONS

This application claims the benefit of Korean Patent Application No. 10-2011-0130474, filed on Dec. 7, 2011, in the Korean Intellectual Property Office, the disclosure of which is incorporated herein in its entirety by reference.

BACKGROUND

1. Field

The inventive concept relates to a magnetic device and to a method of manufacturing the same. More particularly, the inventive concept relates to a magnetic device including a non-volatile magnetic layer, and to a method of manufacturing the magnetic device.

2. Description of the Related Art

Many researches into electronic devices using magnetic resistive characteristics of magnetic tunnel junction (MTJ) have been made. In particular, as a MTJ cell of a highly-integrated magnetic random access memory (MRAM) device is miniaturized, a spin transfer torque (STT)-MRAM that stores information by using a physical phenomenon called STT, i.e., by applying a current directly to the MTJ cell and inducing magnetization inversion, has drawn attention. A MTJ structure with a minute size needs to be formed to implement a highly-integrated STT-MRAM. An etching technology that may readily implement a reliable MTJ cell for when the MTJ structure with a minute size is formed needs to be developed.

SUMMARY

The inventive concept provides a method of manufacturing a magnetic device with a non-volatile magnetic layer via an etching process to manufacture a highly-integrated, high-density magnetic device.

The inventive concept also provides a magnetic device including a magnetic pattern having a large aspect ratio for use in a highly-integrated, high-density magnetic device.

According to an aspect of the inventive concept, there is provided a method of manufacturing a magnetic device, the method including forming a stack structure, the stack structure including a magnetic layer, and etching the stack structure by using an etching gas, the etching gas including at least 80% by volume of $H_2$ gas.

Etching the stack structure may include using an etching gas including $H_2$ gas and an additional gas, the additional gas including an inert gas and/or $NH_3$ gas.

The inert gas in the additional gas may include at least one of $N_2$, Ne, Ar, Kr, and Xe.

Etching the stack structure may include using an etching gas without halogens.

Forming the stack structure may include using at least one of Co/Pd, Co/Pt, Co/Ni, Fe/Pd, Fe/Pt, MgO, PtMn, IrMn, a CoFe alloy, and a CoFeB alloy.

Etching the stack structure may include performing a plasma etching process.

Etching the stack structure may include using a plasma etching apparatus including a source power output unit for applying a source power and a bias power output unit for applying a bias power, and repeatedly performing an operation in which at least one power of the source power and the bias power alternates between an on state and an off state.

The method may further include, before etching the stack structure, exposing a region of the stack structure to hydrogen plasma.

Forming the stack structure may include forming the magnetic layer between an upper electrode and a lower electrode, the upper and lower electrodes facing each other, and etching of the stack structure may include etching the upper electrode, the lower electrode, and the magnetic layer by using the etching gas.

According to another aspect of the inventive concept, there is provided a method of manufacturing a magnetic device, the method including forming a stack structure, the stack structure including a lower magnetic layer, a tunneling barrier layer, and an upper magnetic layer sequentially stacked from bottom to top, forming a mask pattern on the stack structure, such that a portion of the stack structure is covered, performing a first etching through the mask pattern to etch a first portion of the stack structure, the first portion including at least the upper magnetic layer and the tunneling barrier layer, and the first etching including use of a first etching gas having at least 80% by volume of $H_2$ gas and a first additional gas, and performing a second etching through the mask pattern to etch a second portion of the stack structure, the second portion including the lower magnetic layer of the stack structure, and the second etching being performed at a different etching atmosphere than the first etching.

The second etching may include using a second etching gas having at least 80% by volume of $H_2$ gas and a second additional gas, the second additional gas including a different component than the first additional gas.

Each of the first additional gas and the second additional gas may include an inert gas or $NH_3$ gas.

Each of the first additional gas and the second additional gas may include at least one of $N_2$, $NH_3$, Ne, Ar, Kr, or Xe.

The first additional gas may include at least one of $N_2$, Ne, Ar, Kr, or Xe, and the second additional gas includes $NH_3$.

Forming the stack structure may further include forming a lower electrode layer and an upper electrode layer, the lower magnetic layer, the tunneling barrier layer, and the upper magnetic layer being interposed between the lower electrode layer and the upper electrode layer, performing the first etching may include etching a portion of the upper electrode layer by using the first etching gas so that the upper electrode layer is separated into a plurality of upper electrodes, and performing the second etching may include etching a portion of the lower electrode layer by using the second etching gas so that the lower electrode layer is separated into a plurality of lower electrodes.

Performing each of the first etching and the second etching may include using a plasma etching process.

Performing each of the first etching and the second etching may include using a plasma etching apparatus having a source power output unit for applying a source power and a bias power output unit for applying a bias power, and at least one of the first etching and the second etching may include repeatedly performing an operation in which the source or bias power alternates between an on state and an off state.

The first etching may include applying the bias power in a constant wave mode, and the second etching includes repeatedly performing an operation in which the bias power alternates between an on state and an off state.

The method may further include, after forming the mask pattern and before performing the first etching, exposing a top surface of the stack structure to hydrogen plasma.

Forming the stack structure may include using a first material and a second material, the first material being at least one of Co/Pd, Co/Pt, Co/Ni, Fe/Pd, Fe/Pt, MgO, PtMn, IrMn, a CoFe alloy, and a CoFeB alloy, and the second material being at least one of Ti, TiN, Ta, TaN, Ru, and W.

According to another aspect of the inventive concept, there is provided a magnetic device, including at least one magnetic resistive device on a substrate, the magnetic resistive device having sidewalls with a substantially vertical profile, wherein a height of the at least one magnetic resistive device is at least 1.5 times a width of the at least one magnetic resistive device.

The at least one magnetic resistive device may include a lower electrode, a magnetic structure, and an upper electrode, which are sequentially stacked in a vertical direction, and each of the lower electrode, the magnetic structure, and the upper electrode has sidewalls with a substantially vertical profile.

The magnetic structure may include a non-volatile metal, and entire sidewalls of each of the lower electrode, the magnetic structure, and the upper electrode may extend along a normal to the substrate.

The magnetic structure may include a lower magnetic layer pattern, a tunneling barrier layer, and an upper magnetic layer pattern, which are sequentially stacked in the vertical direction.

The magnetic structure may include at least one of Co/Pd, Co/Pt, Co/Ni, Fe/Pd, Fe/Pt, MgO, PtMn, IrMn, a CoFe alloy, and a CoFeB alloy.

The height of the at least one magnetic resistive device may be about 1.5 to about 4 times the width of the at least one magnetic resistive device.

According to yet another aspect of the inventive concept, there is provided a method of manufacturing a magnetic device, the method including forming a stack structure, the stack structure including a non-volatile metal layer, and etching the stack structure, including the non-volatile metal layer, with an etching gas including at least 80% by volume of $H_2$ gas.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
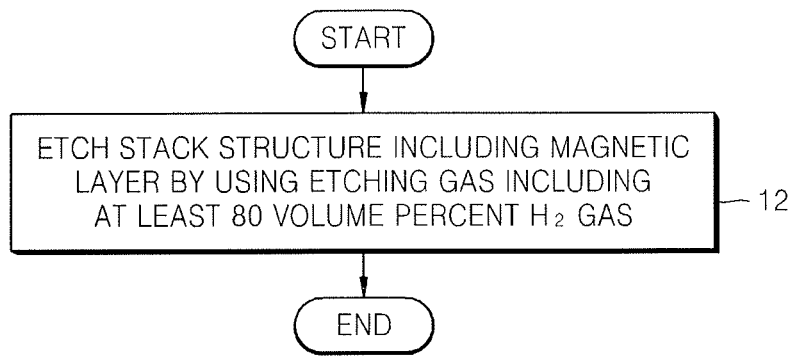
FIG. 1 illustrates a flowchart of a method of manufacturing a magnetic device according to an exemplary embodiment of the inventive concept.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

It will be understood that, although the terms first, second, third etc. may be used herein to describe various elements, components, regions, layers and/or sections, these elements, components, regions, layers and/or sections should not be limited by these terms. These terms refer to a particular order, rank, or superiority and are only used to distinguish one element, component, region, layer or section from another element, component, region, layer or section. Thus, a first element, component, region, layer or section discussed below could be termed a second element, component, region, layer or section without departing from the teachings of the example embodiment. For example, a first element may be referred to as a second element, and similarly, a second element may be referred to as a first element without departing from the scope of protection of the inventive concept.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

If any embodiment is implemented otherwise, a particular process may be performed differently from the described order. For example, two continuously-described processes may be substantially simultaneously performed or in an opposite order to the described order.

In the drawings, for example, illustrated shapes may be deformed according to fabrication technology and/or tolerances. Therefore, the exemplary embodiments of the present invention are not limited to certain shapes illustrated in the present specification, and may include modifications of shapes caused in fabrication processes.

FIG. 1 is a flowchart illustrating a method of manufacturing a magnetic device according to an exemplary embodiment of the inventive concept.

In operation 12 of FIG. 1, a stack structure including at least one magnetic layer is etched using an etching gas including at least 80% by volume of $H_2$ gas.

In some embodiments, etching of the stack structure is performed by a plasma etching process. For example, the etching process of operation 12 may be performed using a plasma etching apparatus including a source power output unit for applying a source power and a bias power output unit for applying a bias power. A plasma etching apparatus 60 illustrated in FIG. 6, for example, may be used as the plasma etching apparatus. In the etching process of operation 12, in order to output at least one of the source power and the bias power in a pulsed mode, a power applied in the pulsed mode may be maintained in an off state according to a predetermined period. The source power in the pulsed mode and the bias power in the pulsed mode will be described below with reference to FIGS. 6 and 7A through 7E in more detail.

In some embodiments, the etching process of operation 12 may be performed at a temperature of about (−10)° C. to about 65° C. under pressure of about 2 mTorr to about 5 mTorr.

The etching gas in the etching process of operation 12 does not include halogen-containing gas. In a dry etching process, e.g., a plasma etching process, using a halogen-containing etching gas, e.g., as used in a conventional magnetic layer etching process, non-volatile etching by-products may be re-deposited on sidewalls of a pattern formed as an etching resultant structure. In addition, halogen-containing etching residuals that deteriorate magnetization characteristics of a magnetic layer may remain on the surface of the pattern formed as the etching resultant structure, thereby deteriorating characteristics of a magnetic resistive device.

In particular, the dry etching process for forming a magnetic resistive device includes etching of a magnetic tunnel junction (MTJ) structure, which drives the magnetic resistive device. The MTJ structure includes a free layer, a tunneling barrier layer, and a fixing layer. The tunneling barrier layer of the MTJ structure includes a ferromagnetic material, e.g., CoFeB or the like, and magnesium oxide (MgO). The ferromagnetic material and magnesium oxide may be damaged during a dry etching process with halogen-containing gas, e.g., during chlorine (Cl)-based plasma etching, thereby causing damage to the tunneling barrier layer and corrosion in the MTJ structure.

However, in a method of manufacturing a magnetic device according to the inventive concept, a stack structure including a magnetic layer may be etched using an etching gas that includes at least 80% by volume of $H_2$ and no halogen-containing elements, thereby solving the problems in conventional processes.

Figure 2:
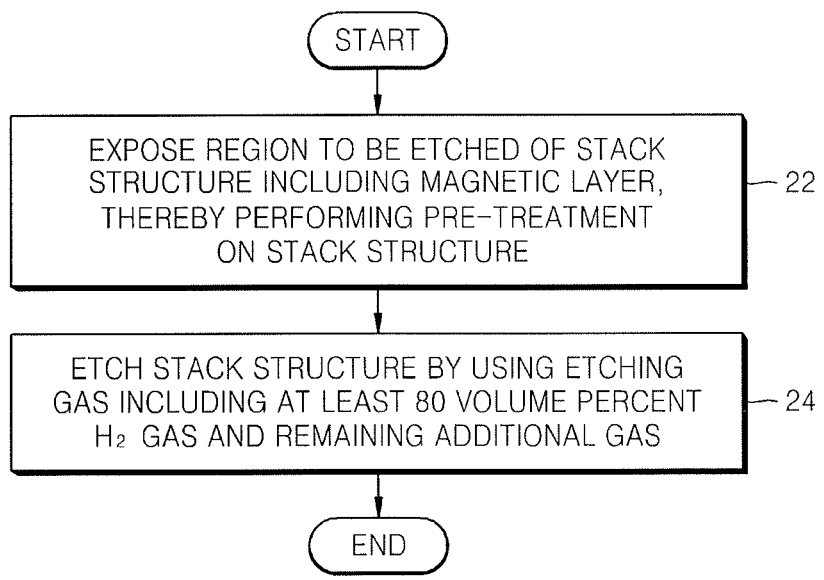
FIG. 2 illustrates a flowchart of a method of manufacturing a magnetic device according to another exemplary embodiment of the inventive concept.

FIG. 2 is a flowchart illustrating a method of manufacturing a magnetic device according to another exemplary embodiment of the inventive concept.

In operation 22 of FIG. 2, a region to be etched of a stack structure including at least one magnetic layer is exposed to hydrogen plasma, thereby performing pre-treatment on the stack structure.

In some embodiments, in order to perform the pre-treatment process in operation 22, the stack structure is loaded into a chamber for plasma etching and only $H_2$ gas is supplied to the chamber, thereby generating hydrogen plasma. Accelerated reactive hydrogen ions may be supplied to the region to be etched of the stack structure due to the pre-treatment process, and a chemical reaction between the region to be etched and the hydrogen ions may occur on the surface of the region to be etched. As a result, when the hydrogen gas ions collide with the region to be etched in the pre-treatment process, subsequent chemical and physical etching processes may be easily performed and an etching rate may be accelerated.

In some embodiments, the pre-treatment process of operation 22 may be performed for about 10 seconds to about 10 minutes. The pre-treatment process of operation 22 may be performed at a temperature of about (−10)° C. to about 65° C. under pressure of about 2 mTorr to about 5 mTorr. If necessary, the pre-treatment process of operation 22 may be omitted.

In operation 24, after the pre-treatment process, the region to be etched of the stack structure may be etched using an etching gas including at least 80% by volume of $H_2$ gas. The remaining 20% by volume or less of the etching gas may include additional gas, e.g., other than hydrogen gas.

In some embodiments, etching of the stack structure may be performed by a plasma etching process. In some embodiments, the additional gas may include at least one of an inert gas and $NH_3$ gas. For example, the additional gas may include at least one of $N_2$, $NH_3$, Ne, Ar, Kr, and Xe.

The etching process of operation 24 may be performed after the pre-treatment process of operation 22 and in a same chamber. The etching process of operation 24 may be performed at a temperature of about (−10)° C. to about 65° C. under pressure of about 2 mTorr to about 5 mTorr.

When the etching process of operation 24 is performed, accelerated reactive hydrogen ions along with accelerated ions of the additional gas may be supplied to the region to be etched of the stack structure. In the region to be etched, physical etching due to the accelerated ions generated from the additional gas may be performed simultaneously with a chemical reaction with the accelerated hydrogen ions that reach the surface of the region to be etched. The additional gas includes atoms having a larger atomic weight than that of hydrogen atoms. Thus, the accelerated ions generated from the additional gas collide stronger with the stack structure to be etched than the hydrogen atoms. As a result, a relatively large physical force is applied to the region to be etched of the stack structure so that physical etching of the stack structure may be easily performed.

Figure 3:
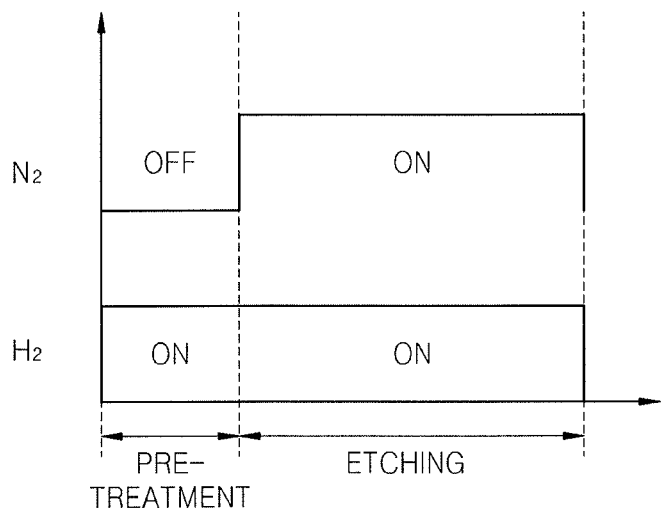
FIG. 3 illustrates a gas supply pulse graph of a gas supply operation in a pre-treatment process and an etching process of the methods of manufacturing a magnetic device illustrated in FIGS. 1 and 2.

FIG. 3 is a gas supply pulse graph illustrating a gas supply operation in the pre-treatment process of operation 22 illustrated in FIG. 2 and the etching process of operation 24 illustrated in FIG. 2. For example, as illustrated in FIG. 3, ions of hydrogen gas may be supplied continuously in the pretreatment and etching stages, i.e., operations 22 and 24 of FIG. 2, while the additional gas, e.g., $N_2$ gas, may be supplied only during etching.

In the etching process of operation 12 of FIG. 1 and the etching process of operation 24 of FIG. 2, the stack structure that has a layer to be etched may include various types of magnetic layers. In some embodiments, the stack structure includes at least one non-volatile magnetic layer. For example, the stack structure may include a magnetic layer formed of at least one of Co/Pd, Co/Pt, Co/Ni, Fe/Pd, Fe/Pt, MgO, PtMn, IrMn, a CoFe alloy, or a CoFeB alloy.

The etching process of operation 12 of FIG. 1 and the etching process of operation 24 of FIG. 2 may be performed using plasma that is generated from an inductively coupled plasma (ICP) source, a capacitively coupled plasma (CCP) source, an electron cyclotron resonance (ECR) plasma source, a helicon-wave excited plasma (HWEP) source, or an adaptively coupled plasma (ACP) source.

Figure 4:
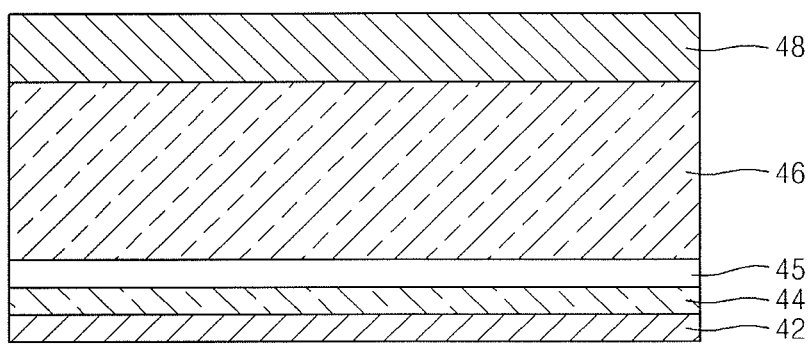
FIG. 4 illustrates a cross-sectional view of an exemplary stack structure used in a method of manufacturing a magnetic device according to an embodiment of the inventive concept.
Figure 5:
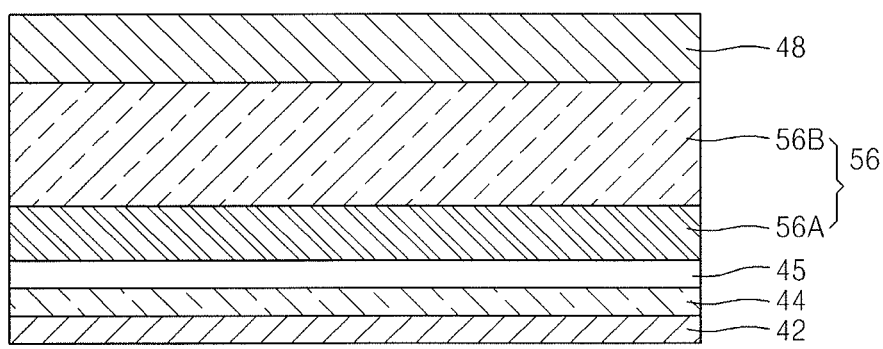
FIG. 5 illustrates a cross-sectional view of another exemplary stack structure used in a method of manufacturing a magnetic device according to an embodiment of the inventive concept.

FIGS. 4 and 5 are cross-sectional views of stack structures 40 and 50 that may be etched using an etching gas including at least 80% by volume of $H_2$ gas according to embodiments of the inventive concept. For clarity, a repeated description thereof is omitted.

In more detail, as illustrated in FIG. 4, the stack structure 40 may include a lower electrode layer 42, a lower magnetic layer 44, a tunneling barrier layer 45, an upper magnetic layer 46, and an upper electrode layer 48, which are sequentially stacked from bottom to top.

The lower electrode layer 42 may include at least one of, e.g., Ti, Ta, Ru, TiN, TaN, or W. In some embodiments, the lower electrode layer 42 may have a bi-layer structure, e.g., Ti\Ru, Ta\Ru, TiN\Ru, TaN\Ru, and TiN\Ru. In some embodiments, the lower electrode layer 42 may have a thickness of about 20 to 50 Å.

The lower magnetic layer 44 may include at least one of, e.g., Fe, Co, Ni, Pd, and Pt. In some embodiments, the lower magnetic layer 44 may be formed of a Co-M1 alloy (where $M_1$ is at least one metal selected from the group consisting of Pt, Pd, and Ni) or a Fe-$M_2$ alloy (where M2 is at least one metal selected from the group consisting of Pt, Pd, and Ni). In some embodiments, the lower magnetic layer 44 may further include at least one of C, Cu, Ag, Au, or Cr. In some embodiments, the lower magnetic layer 44 has a thickness of about 10 Å to about 50 Å.

The upper magnetic layer 46 may include at least one of, e.g., Co, a Co-$M_1$ alloy (where $M_1$ is at least one metal selected from Pt, Pd, or Ni), a Fe-$M_2$ alloy (where $M_2$ is at least one metal selected from Pt, Pd, or Ni), Ru, Ta, Cr, and Cu. In some embodiments, the upper magnetic layer 46 has a thickness of about 30 Å to 200 Å.

In some embodiments, at least one of the lower magnetic layer 44 and the upper magnetic layer 46 includes a perpendicular magnetic anisotropy (PMA) material. In some embodiments, at least one of the lower magnetic layer 44 and the upper magnetic layer 46 includes a synthetic anti-ferromagnet (SAF) structure. The SAF structure is a formed by inserting a Ru intermediate layer in a ferromagnetic stack structure. For example, the SAF structure may have a multi-layer structure of CoFeB/Ta/(Co/Pt)m/Ru/(Co/Pd)n (where m and n are natural numbers). The SAF structure that may be employed in the inventive concept is not limited thereto, and various modified structures may be used.

The tunneling barrier layer 45 that is interposed between the lower magnetic layer 44 and the upper magnetic layer 46 may be formed of, e.g., MgO, $Al_2O_3$, $B_2O_3$, and/or $SiO_2$. In some embodiments, the tunneling barrier layer 45 has a thickness of about 5 Å to about 30 Å.

The upper electrode layer 48 may include at least one of, e.g., Ti, Ta, Ru, TiN, TaN, and/or W. In some embodiments, the upper electrode layer 48 may have a bi-layer structure of, e.g., T\Ru, Ta\Ru, TiN\Ru, TaN\Ru, or TiN\Ru. In some embodiments, the upper electrode layer 48 may have a thickness of about 20 Å to about 50 Å.

The lower magnetic layer 44 and the upper magnetic layer 46 of the stack structure 40 are not limited to the above description and may be modified variously. For example, the description of the lower magnetic layer 44 may apply to the upper magnetic layer 46 and vice versa.

In some embodiments, the stack structure 40 may be used in implementing an MTJ device using perpendicular magnetization.

As illustrated in FIG. 5, the stack structure 50 may include a lower electrode layer 42, a lower magnetic layer 44, a tunneling barrier layer 45, an upper magnetic layer 56, and an upper electrode layer 48, which are sequentially stacked from bottom to top.

The upper magnetic layer 56 may include a pinned layer 56A and a pinning layer 56B, which are sequentially stacked on the tunneling barrier layer 45. The pinned layer 56A may include at least one ferromagnetic material selected from the group consisting of Co, Fe, Pt, and Pd. The pinned layer 56A may have the SAF structure illustrated in FIG. 4. In some embodiments, the pinned layer 56A may have a thickness of about 30 Å to about 50 Å.

The pinning layer 56B may include an antiferromagnetic material. In some embodiments, the pinning layer 56B may include at least one of, e.g., PtMn, IrMn, NiMn, FeMn, MnO, MnS, MnTe, $MnF_2$, $FeCl_2$, FeO, $CoCl_2$, CoO, $NiCl_2$, NiO, or Ni. In some embodiments, the pinning layer 56B has a thickness of about 50 to 150 Å.

In some embodiments, the stack structure 50 may be used in implementing an MTJ device using horizontal magnetization.

Figure 6:
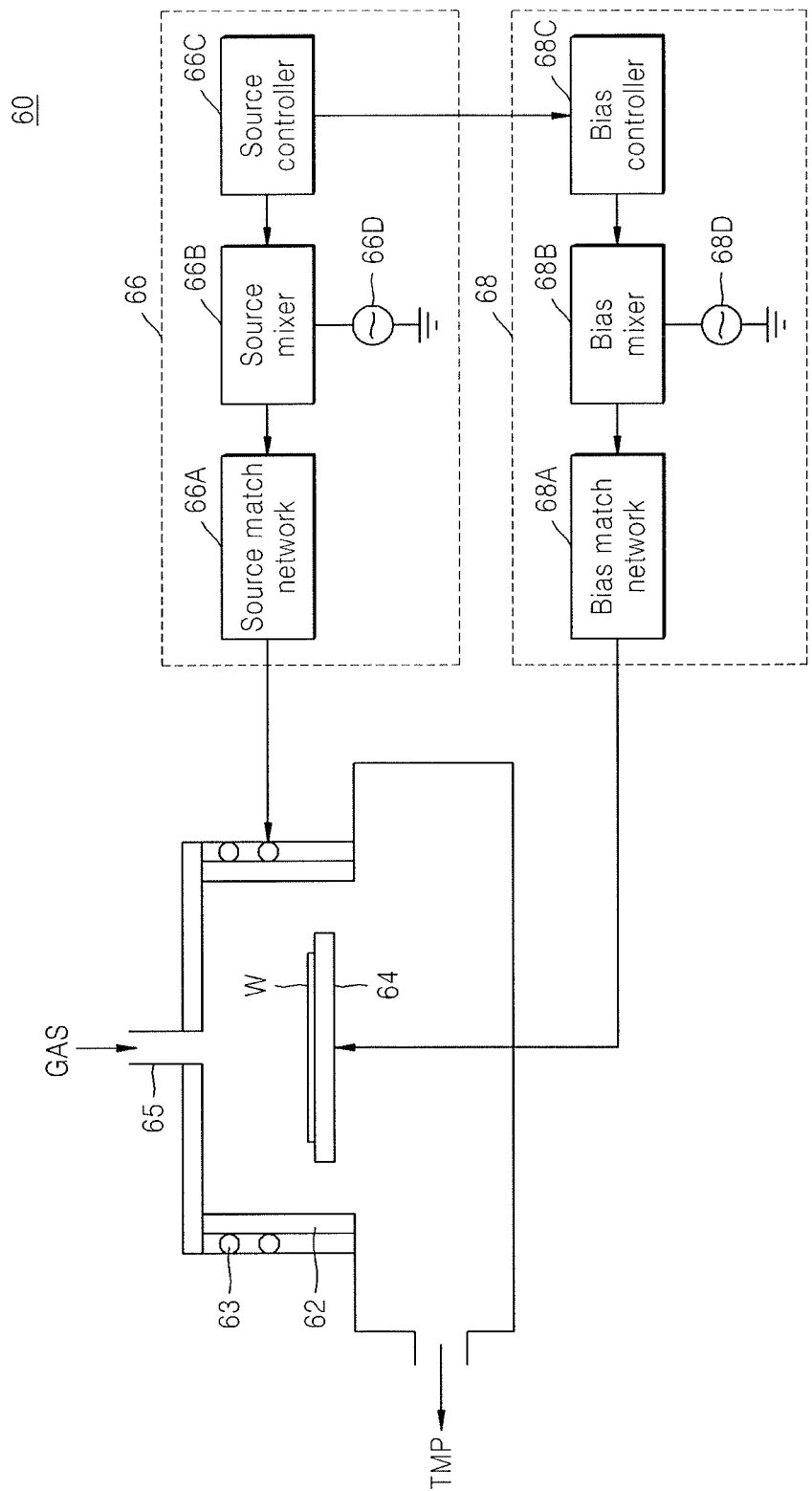
FIG. 6 illustrates a schematic view of an exemplary plasma etching apparatus used in a method of manufacturing a magnetic device according to an embodiment of the inventive concept.

FIG. 6 illustrates a schematic view of the plasma etching apparatus 60 that may perform a plasma etching process of a method of manufacturing a magnetic device according to an embodiment of the inventive concept.

Referring to FIG. 6, the plasma etching apparatus 60 may include a chamber 62, a source electrode 63, and a bias electrode 64. The bias electrode 64 serves as a holder for supporting a substrate W. The source electrode 63 may have a coil shape in which the chamber 62 is wound a plurality of times.

A radio frequency (RF) source power may be applied to the source electrode 63, and an RF bias power may be applied to the bias electrode 64. An etching gas used in plasma etching flows into the chamber 62 via a gas inlet 65. An unreacted etching gas and reaction by-products that remain after etching are discharged from the chamber 62 by using a turbo molecular pump (TMP).

In a plasma etching apparatus using a CCP method, a flat type electrode that is disposed in the chamber 62 close to the gas inlet 65, instead of the source electrode 63, may be used.

The plasma etching apparatus 60 may further include a source power output unit 66 and a bias power output unit 68. The source power output unit 66 and the bias power output unit 68 may output a source power and a bias power in a mode appropriate for performing a synchronous pulse plasma etching process, respectively.

The source power output unit 66 may include a source match network 66A, a source mixer 66B, a source controller 66C, and a source RF generator 66D. The bias power output unit 68 may include a bias match network 68A, a bias mixer 68B, a bias controller 68C, and a bias RF generator 68D.

The source power output from the source power output unit 66 is applied to the source electrode 63. The source electrode 63 serves to generate plasma in the chamber 62. The bias power output from the bias power output unit 68 is applied to the bias electrode 64. The bias electrode 64 serves to control ion energy that enters the substrate W.

The source controller 66C of the source power output unit 66 may output a pulse-modulated RF source power having a first frequency and a first duty cycle, and may output a control signal including information regarding a phase of the RF source power, to the RF bias power output unit 68. The source mixer 66B receives a source RF signal output from the source RF generator 66D and a source pulse signal output from the source controller 66C and mixes them, thereby outputting a pulse-modulated RF source power.

The bias power output unit 68 outputs a RF bias power having a second frequency and a second duty cycle to the bias electrode 64 in response to the control signal output from the source power output unit 66.

In some embodiments, the RF bias power is applied to the bias electrode 64 from the bias power output unit 68 so that ions of plasma formed on the substrate W inside the chamber 62 have directivity.

A heater (not shown) for heating the substrate W supported on the bias electrode 64 and a temperature sensor (not shown) for controlling the internal temperature of the chamber 62 may be additionally disposed on the bottom of the bias electrode 64 or inside the bias electrode 64.

In some embodiments, the source power output unit 66 and the bias power output unit 68 may be controlled to output power in a constant wave mode or power in a pulsed mode selectively, if necessary, respectively. To this end, the source power output unit 66 and the bias power output unit 68 may operate to control interactive conversion of an on state and an off state of power output, respectively. For example, the on state and the off state of each of the source power output unit 66 and the bias power output unit 68 may be controlled so that a source power in the pulsed mode and a bias power in the pulsed mode may be output from the source power output unit 66 and the bias power output unit 68, respectively.

Figure 7A:
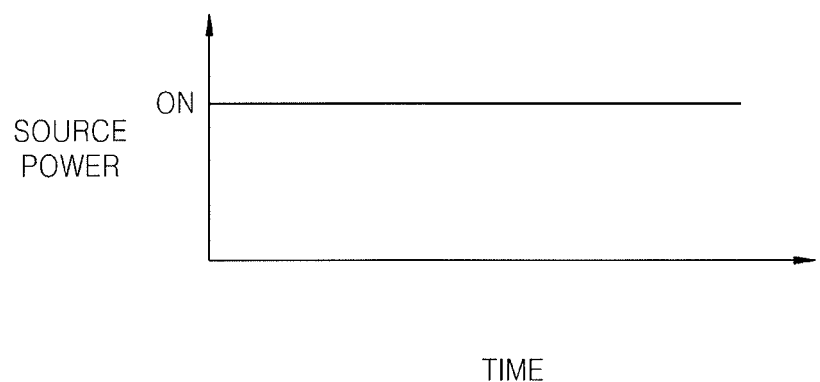
FIG. 7A illustrates a graph showing a source power output in a constant wave mode in the plasma etching apparatus illustrated in FIG. 6 as a function of time.
Figure 7B:
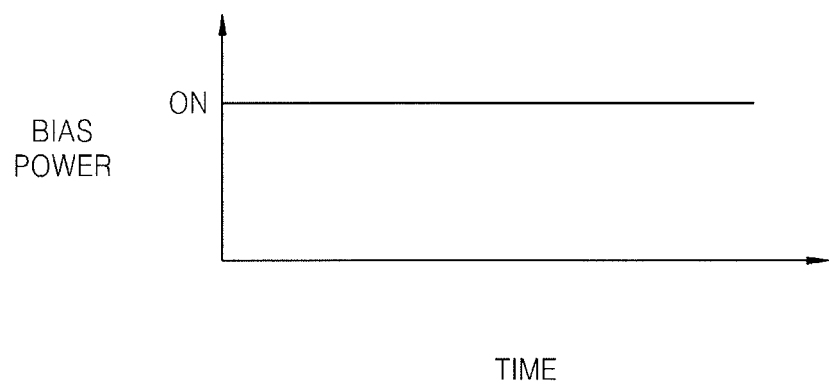
FIG. 7B illustrates a graph showing a bias power output in a constant wave mode in the plasma etching apparatus illustrated in FIG. 6 as a function of time.
Figure 7C:
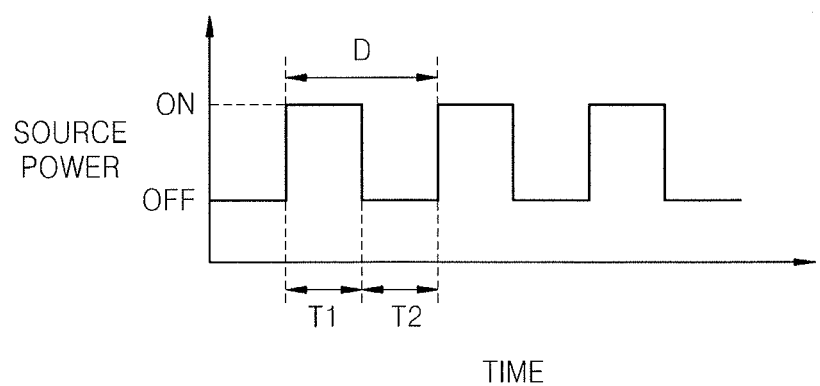
FIG. 7C illustrates a graph showing a duty cycle of a source power output in a pulsed mode in the plasma etching apparatus illustrated in FIG. 6 as a function of a duty cycle time.
Figure 7D:
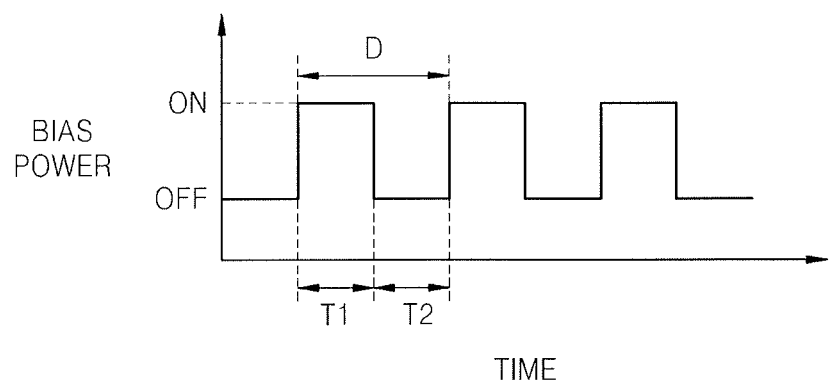
FIG. 7D illustrates a graph showing duty cycle of a bias power output in a pulsed mode in the plasma etching apparatus illustrated in FIG. 6 as a function of time.

FIG. 7A is a graph of a source power output in a constant wave mode in the plasma etching apparatus 60 as a function of time. FIG. 7B is a graph of a bias power output in the constant wave mode in the plasma etching apparatus 60 as a function of time. FIG. 7C is a graph of a duty cycle D of a source power output in a pulse mode in the plasma etching apparatus 60 as a function of time. FIG. 7D is a graph of a duty cycle D of a bias power output in a pulse mode in the plasma etching apparatus 60 as a function of time.

In FIGS. 7C and 7D, an on state time T1 and an off state time T2 may be set in various ways. The on state time T1 and the off state time T2 may be the same or not. The on state time T1 and the off state time T2 may be arbitrarily selected according to quality and thickness of a layer to be etched, an etching atmosphere, or the like. In some embodiments, the on state time T1 and the off state time T2 may be variably set as a process time elapses.

Figure 7E:
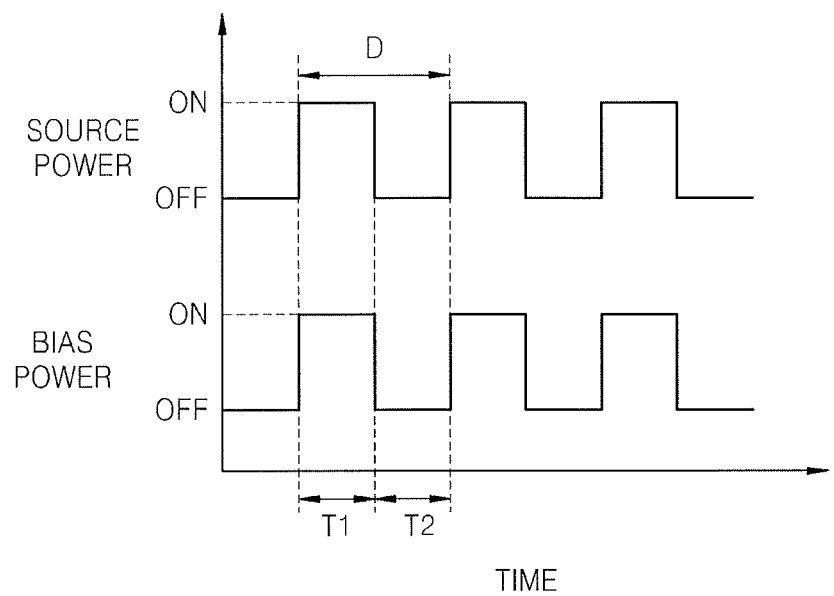
FIG. 7E illustrates a graph showing a duty cycle of a source power and a bias power that are output in a pulsed mode so as to perform an etching process using a synchronous pulse plasma etching of the plasma etching apparatus illustrated in FIG. 6 as a function of time.

FIG. 7E is a graph showing duty cycle D of a source power and a bias power that are output in a pulsed mode so as to perform an etching process by using a synchronous pulse plasma etching of the plasma etching apparatus 60 as a function of time.

Figure 8A:
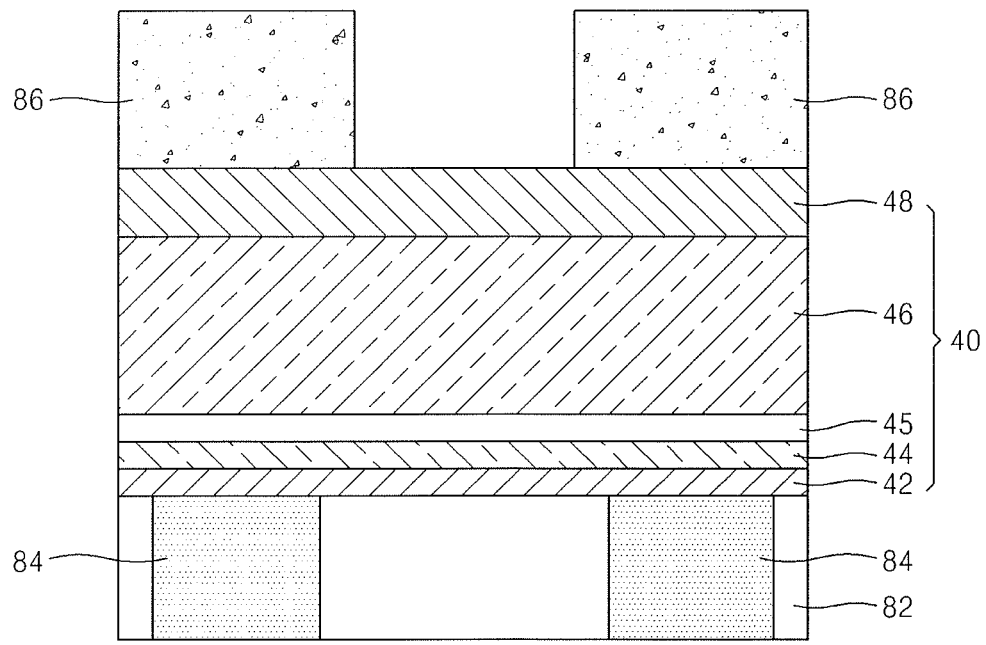
FIGS. 8A through 8C illustrate cross-sectional views of stages in a method of manufacturing a magnetic device according to another exemplary embodiment of the inventive concept.
Figure 8B:
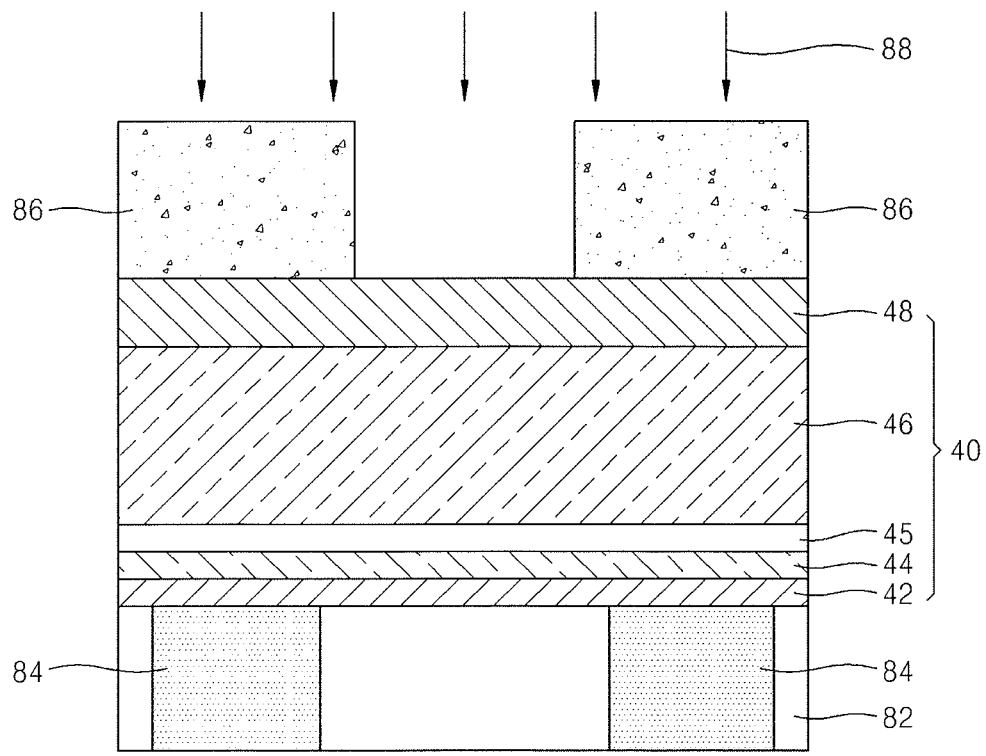
Figure 8C:
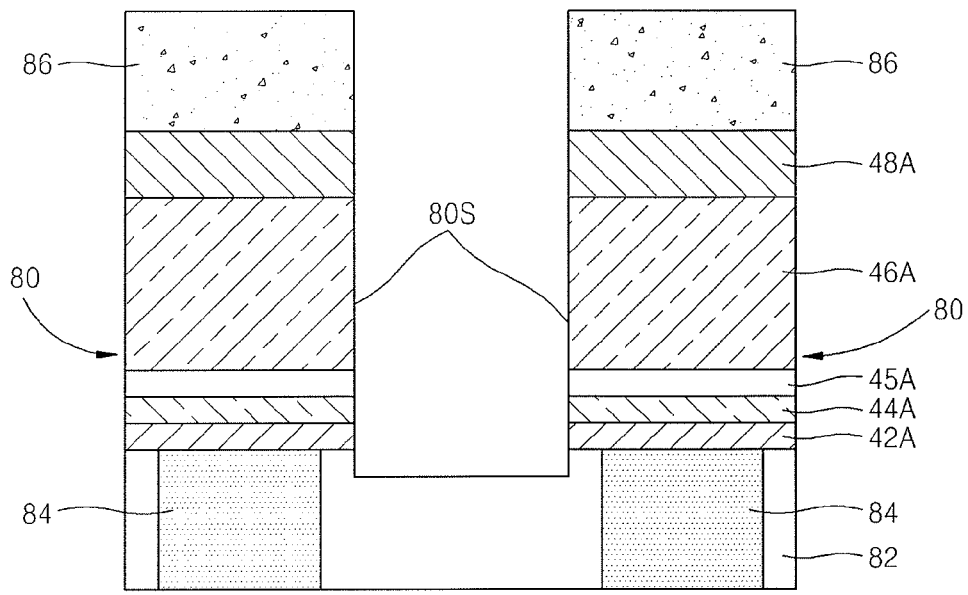

FIGS. 8A through 8C are cross-sectional views of stages in a method of manufacturing a magnetic device 80 (see FIG. 8C), according to another exemplary embodiment of the inventive concept. In the current embodiment, the method of manufacturing the magnetic device 80, including a process of etching the stack structure 40 of FIG. 4, will be described.

Referring to FIG. 8A, the stack structure 40 described with reference to FIG. 4 may be formed on a lower structure, i.e., a structure including an interlayer insulating layer 82 and a lower electrode contact 84 formed through the interlayer insulating layer 82. Then, a mask pattern 86 for exposing a portion of a top surface of the upper electrode layer 48 may be formed on the stack structure 40.

The mask pattern 86 may be formed on the stack structure 40 on the same axis as the lower electrode contact 84, e.g., the mask pattern 86 may be parallel and overlapping with respect to the lower electrode contact 84. In some embodiments, the mask pattern 86 may include at least one of, e.g., Ru, W, TiN, TaN, Ti, and Ta. In some embodiments, the mask pattern 86 may have a bi-layer structure, e.g., Ru\TiN or TiN\W, and may have a thickness of about 300 Å to about 800 Å.

Referring to FIG. 8B, the resultant structure of FIG. 8A may be loaded into a plasma etching chamber. For example, the resultant structure of FIG. 8A may be loaded onto the bias electrode 64 in the chamber 62 of the plasma etching apparatus 60.

Next, similar to operation 22 of FIG. 2, the exposed region of the upper electrode layer 48 of the stack structure 40 may be exposed to hydrogen plasma 88 in the chamber 62, thereby performing pre-treatment on the stack structure 40. The pre-treatment process using the hydrogen plasma 88 may be omitted if necessary.

Referring to FIG. 8C, similar to operation 24 of FIG. 2, the pre-processed stack structure 40 may be anisotropically etched by using an etching gas including at least 80% by volume of $H_2$ gas and a remaining additional gas and by using the mask pattern 86 as an etching mask.

Etching of the stack structure 40 may be performed by a plasma etching process. As an etching resultant structure of the stack structure 40, a plurality of magnetic devices 80, each including a lower electrode 42A, a lower magnetic layer pattern 44A, a tunneling barrier layer 45A, an upper magnetic layer pattern 46A, an upper electrode 48A, and the remaining mask pattern portion 86, which are sequentially stacked from bottom to top, may be formed. In each of the plurality of magnetic devices 80, the remaining mask pattern portion 86 and the upper electrode 48A serve as one electrode. Each of the plurality of magnetic devices 80 may be electrically connected to the lower electrode contact 84. While the stack structure 40 is etched, a portion of the stack structure 40 may be consumed from a top surface of the mask pattern 86 by etching, i.e., a total thickness of the pattern portion 86 after the anisotropic etching may be reduced relative to the total thickness before the anisotropic etching.

For example, the etching gas may include about 80% by volume to about 95% by volume of $H_2$ gas and about 5% by volume to about 20% by volume of an additional gas. In some embodiments, the additional gas may include, e.g., at least one of $N_2$, $NH_3$, Ne, Ar, Kr, and Xe.

The etching process of the stack structure 40 may be performed in the same chamber as, e.g., and subsequently to, the pre-treatment process of FIG. 8B. In some embodiments, etching of the stack structure 40 may be performed in an atmosphere in which relatively high ion energy and relatively low plasma density are maintained. For example, when the stack structure 40 is etched, ion energy that is higher than about 500 eV and plasma density that is lower than about $1 \times 1011$ cm$^{-3}$ may be maintained. The etching process of the stack structure 40 may be performed at a temperature of about $(-10)°$ C. to about $65°$ C. under pressure of about 2 mTorr to about 5 mTorr.

Figure 9A:
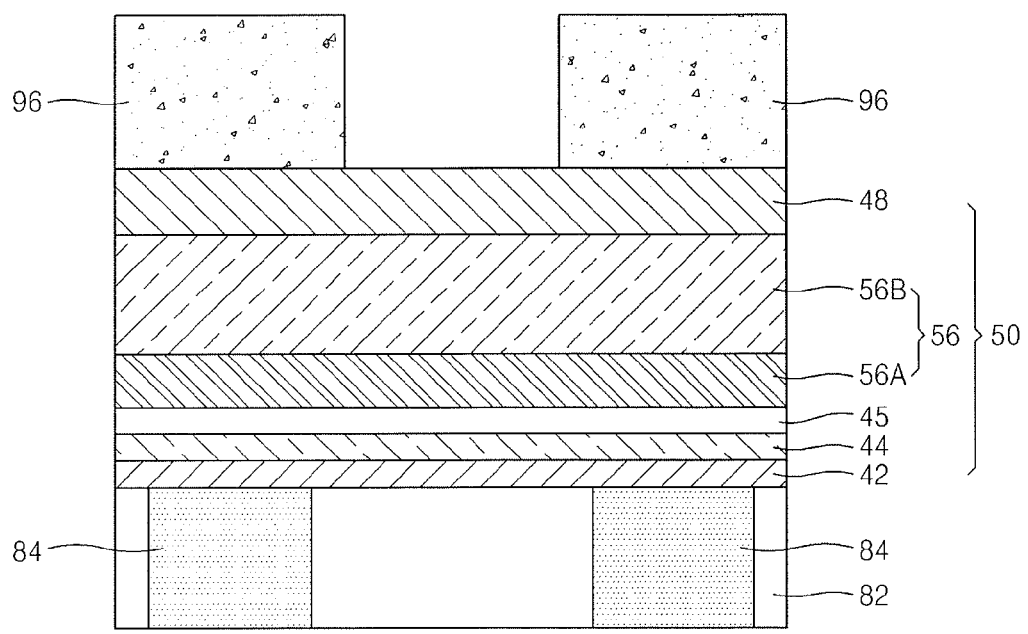
FIGS. 9A through 9C illustrate cross-sectional views of stages in a method of manufacturing a magnetic device according to another exemplary embodiment of the inventive concept.
Figure 9B:
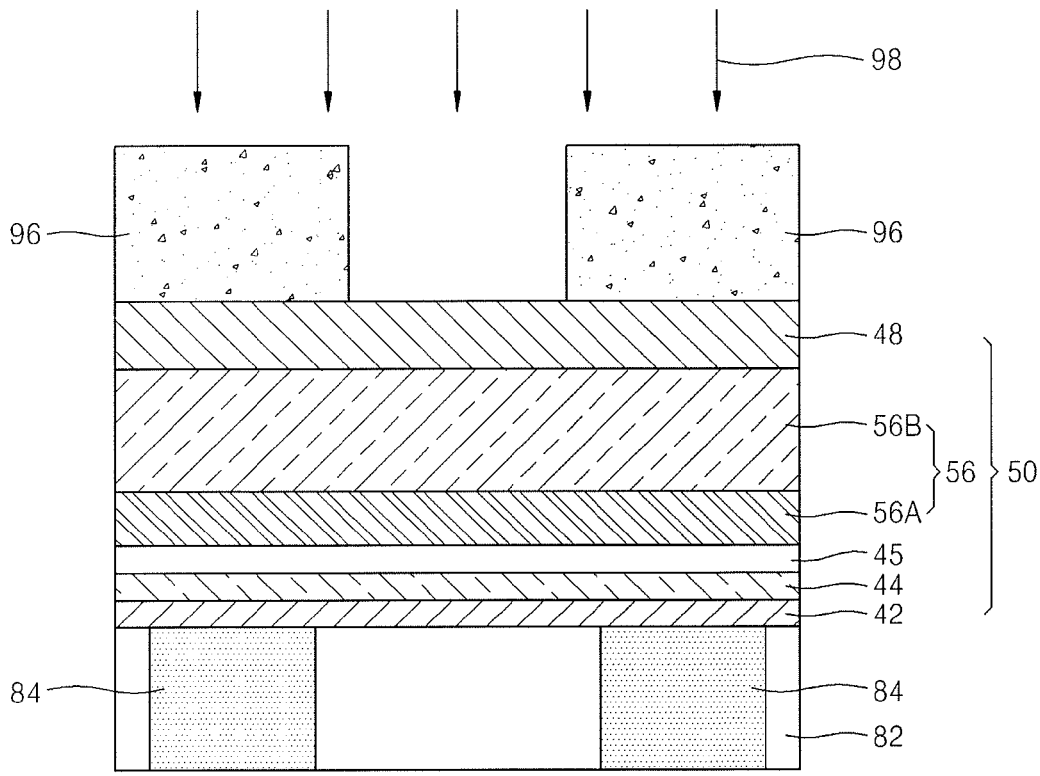
Figure 9C:
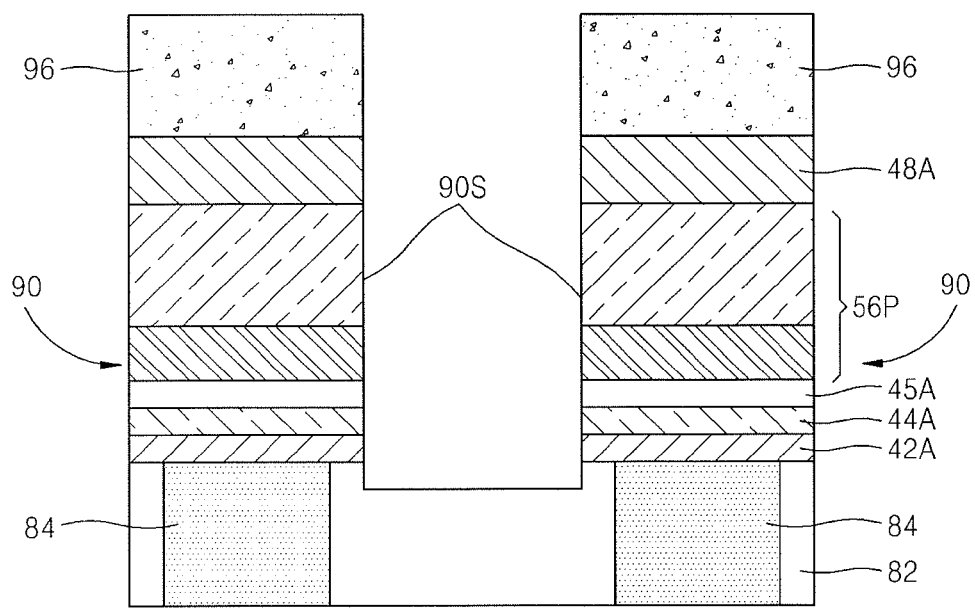

FIGS. 9A through 9C are cross-sectional views of stages in a method of manufacturing a magnetic device 90 (see FIG. 9C), according to another exemplary embodiment of the inventive concept. In the current embodiment, the method of manufacturing the magnetic device 90, including the process of etching the stack structure 50 of FIG. 5, will be described.

Referring to FIG. 9A, the stack structure 50, i.e., as described with reference to FIG. 5, may be formed on the lower structure including the interlayer insulating layer 82 and the lower electrode contact 84. A mask pattern 96 for exposing a portion of the top surface of the upper electrode layer 48 may be formed on the stack structure 50.

The mask pattern 96 may be formed on the stack structure 50 on the same axis as that of the lower electrode contact 84. In some embodiments, the mask pattern 96 may include at least one of, e.g., Ru, W, TiN, TaN, Ti, and Ta. In some embodiments, the mask pattern 96 may have a bi-layer structure, e.g., Ru\TiN or TiN\W. The mask pattern 96 may have a thickness of about 300 Å to about 800 Å.

Referring to FIG. 9B, the resultant structure in FIG. 9A may be loaded into a plasma etching chamber. For example, the resultant structure, including the mask pattern 96, may be loaded onto the bias electrode 64 in the chamber 62 of the plasma etching apparatus 60 of FIG. 6.

Next, as described in operation 22 of FIG. 2, the exposed region of the upper electrode layer 48 of the stack structure 50 in the chamber 62 may be exposed to hydrogen plasma 98, thereby performing pre-treatment on the stack structure 50.

Referring to FIG. 9C, the stack structure 50 that is pre-processed in a plasma state of the etching gas may be anisotropically etched by using the mask pattern 96 as an etching mask and by using the etching gas including at least 80% by volume of $H_2$ gas and the remaining additional gas, as described in operation 24 of FIG. 2.

Etching of the stack structure 50 may be performed by a plasma etching process. As an etching resultant structure of the stack structure 50, a plurality of magnetic devices 90, each including a lower electrode 42A, a lower magnetic layer pattern 44A, a tunneling barrier layer 45A, an upper magnetic layer pattern 56P, an upper electrode 48A, and the remaining mask pattern portion 96, which are sequentially stacked from bottom to top, may be formed. In each of the plurality of magnetic devices 90, the remaining mask pattern portion 96 and the upper electrode 48A serve as one electrode. Each of the plurality of magnetic devices 90 is electrically connected to the lower electrode contact 84. While the stack structure 50 is etched, a portion of the stack structure 50 may be consumed from a top surface of the mask pattern 96 by etching.

For example, the etching gas may include about 80% by volume to about 95% by volume of $H_2$ gas and about 5% by volume to about 20% by volume of an additional gas. In some embodiments, the additional gas may include at least one of, e.g., $N_2$, $NH_3$, Ne, Ar, Kr, or Xe.

The etching process of the stack structure 50 may be performed in the same chamber as the pre-treatment process of FIG. 9B and subsequent to the pre-treatment process. In some embodiments, etching of the stack structure 50 may be performed in an atmosphere in which relatively high ion energy and relatively low plasma density are maintained. For example, when the stack structure 50 is etched, ion energy that is higher than about 500 eV and plasma density that is lower than about $1 \times 1011$ cm$^{-3}$ may be maintained. The etching process of the stack structure 50 may be performed at a temperature of about $(-10)°$ C. to about $65°$ C. under pressure of about 2 mTorr to about 5 mTorr.

In the method of manufacturing the magnetic device 80 illustrated in FIGS. 8A through 8C and the method of manufacturing the magnetic device 90 illustrated in FIGS. 9A through 9C, the plasma etching apparatus 60 of FIG. 6 may be used to perform the etching process of the stack structures 40 or 50. In the plasma etching apparatus 60, while the stack structure 40 or 50 is etched, a source power and a bias power may be output in a constant wave mode, as illustrated in FIGS. 7A and 7B, respectively. In some embodiments, while the stack structure 40 or 50 is etched, the source power in the pulsed mode or the bias power in the pulsed mode in which the source or bias power alternates between an on state and an off state, as illustrated in FIG. 7C or 7D, may be output. In some embodiments, when the stack structure 40 or 50 is etched, in order to perform a synchronous pulse plasma etching process, as illustrated in FIG. 7E, the source power in the pulsed mode and the bias power in the pulsed mode may be simultaneously applied.

Each of the stack structures 40 and 50 may include a non-volatile material layer, e.g., a layer of Pt, Pd, Co, Mg, Fe, Ir, and/or the like, which is not easily etched by a conventional etching process. Since saturation vapor pressure of reaction materials generated during an etching process of a non-volatile material is very low compared to other etching materials, e.g., as compared to volatile materials, the non-volatile materials may have very low etching rates during the etching processes. Accordingly, reaction products, e.g., etching by-products, of the non-volatile materials during the etching process may be re-deposited on sidewalls of a pattern formed after etching. When etching by-products are re-deposited on the sidewalls of the pattern in this way, a sidewall profile of the final pattern formed as a result of etching may be steeply sloped, thereby making control of a critical dimension (CD) difficult. In addition, when non-volatile metal reaction by-products are re-deposited on the sidewalls of the pattern, an electrical short between a lower electrode and an upper electrode occurs may occur, which in turn, may deteriorate MTJ.

On the other hand, in the method of manufacturing a magnetic device according to the inventive concept, when the stack structure 40 or 50, including a non-volatile magnetic layer, is etched, the stack structure 40 or 50 is etched using an etching gas including at least 80% by volume of $H_2$ gas and a remainder of an additional gas. In this regard, the stack structure 40 or 50 may be etched in a single step from the upper electrode layer 48 to the lower electrode layer 42 and may be separated into the plurality of magnetic devices 80 or 90. As a result of etching the stack structure 40 or 50 by using the etching gas including at least 80% by volume of $H_2$ gas and a remainder of an additional gas, etching by-products may be prevented from being re-deposited on each etched surface, i.e., sidewalls 80S of the plurality of magnetic devices 80 or sidewalls 90S of the plurality of magnetic devices 90 in respective FIGS. 8C and 9C, and a magnetic device may have a vertical sidewall profile, i.e., a sidewall extending along a normal to a surface supporting the magnetic devices 80 or 90.

Figure 10A:
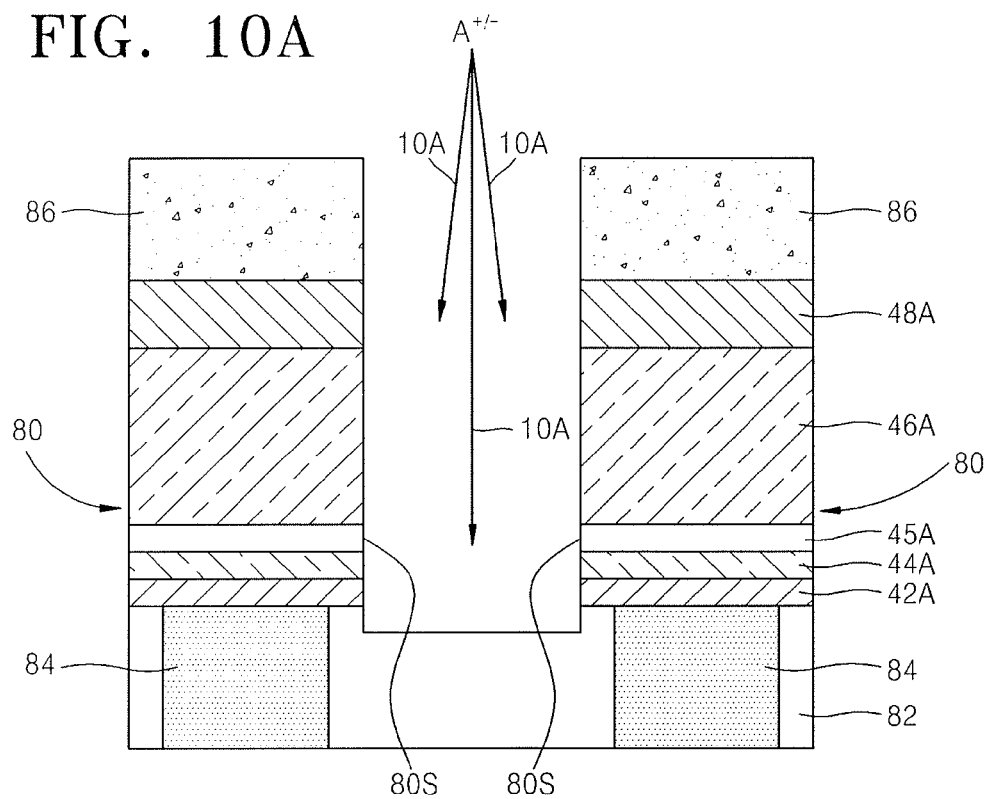
FIG. 10A illustrates a cross-sectional view of movement paths of ions when a stack structure is etched under a condition that a source power and a bias power are output in constant wave modes, respectively.

FIG. 10A illustrates movement paths 10A of ions A+/− when the stack structure 40 is etched under a condition that a source power and a bias power are output in constant wave modes, respectively.

In detail, FIG. 10A illustrates movement paths 1 OA of accelerated ions A+/− that are generated from the etching gas when the stack structure 40 is etched by the process described with reference to FIG. 8C using the plasma etching apparatus 60 under the condition that the source power and the bias power are output in constant wave modes illustrated in FIGS. 7A and 7B, respectively.

Figure 10B:
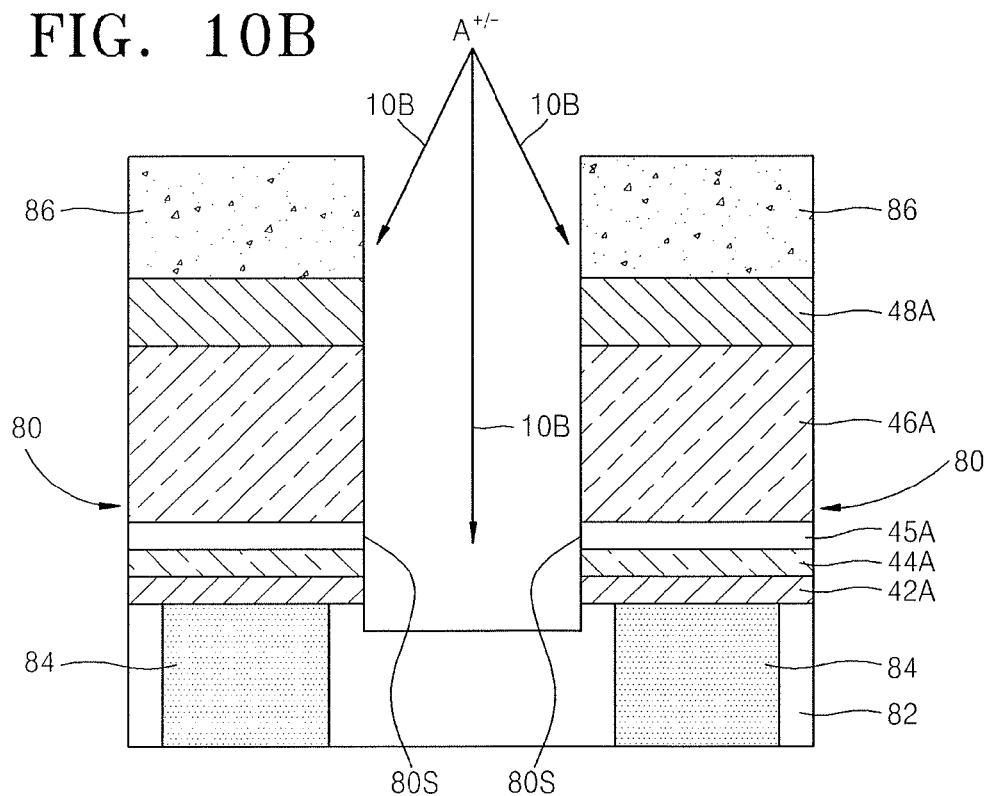
FIG. 10B illustrates a cross-sectional view of movement paths of ions in a synchronous pulse plasma etching process.

FIG. 10B illustrates movement paths 10B of ions A+/− that are generated from the etching gas in a synchronous pulse plasma etching process.

In detail, FIG. 10B illustrates the movement paths 10B of accelerated ions A+/− that are generated from the etching gas when the stack structure 40 is etched by the process described with reference to FIG. 8C using the plasma etching apparatus 60 in a condition that the source power and the bias power are output in the pulsed mode illustrated in FIG. 7E, respectively, thereby performing the synchronous pulse plasma etching process.

As seen in FIGS. 10A and 10B, when the synchronous pulse plasma etching process is performed (FIG. 10B), the movement range of the accelerated ions A+/− increases in comparison with use of constant wave modes by the source power and the bias power (FIG. 10A). Thus, the movement range where the accelerated ions A+/− are dispersed increases. Further, even when by-products are re-deposited on the sidewalls 80S, the re-deposited by-products may be removed due to the plurality of accelerated ions A+/− that are moved in the increased movement range. Such an effect also applies to the etching process of the stack structure 50 described with reference to FIG. 9C. Thus, even when a stack structure including a plurality of magnetic layers is etched so as to manufacture the magnetic device 80 or 90 having a very fine width of several tens of nm, e.g., about 20 nm, the stack structure including the plurality of magnetic layers may be etched using the method of manufacturing a magnetic device, according to the inventive concept, so that miniaturized magnetic devices each having a vertical sidewall profile may be easily manufactured due to high anisotropic etching that may be performed without re-deposition of the etching by-products.

Figure 11:
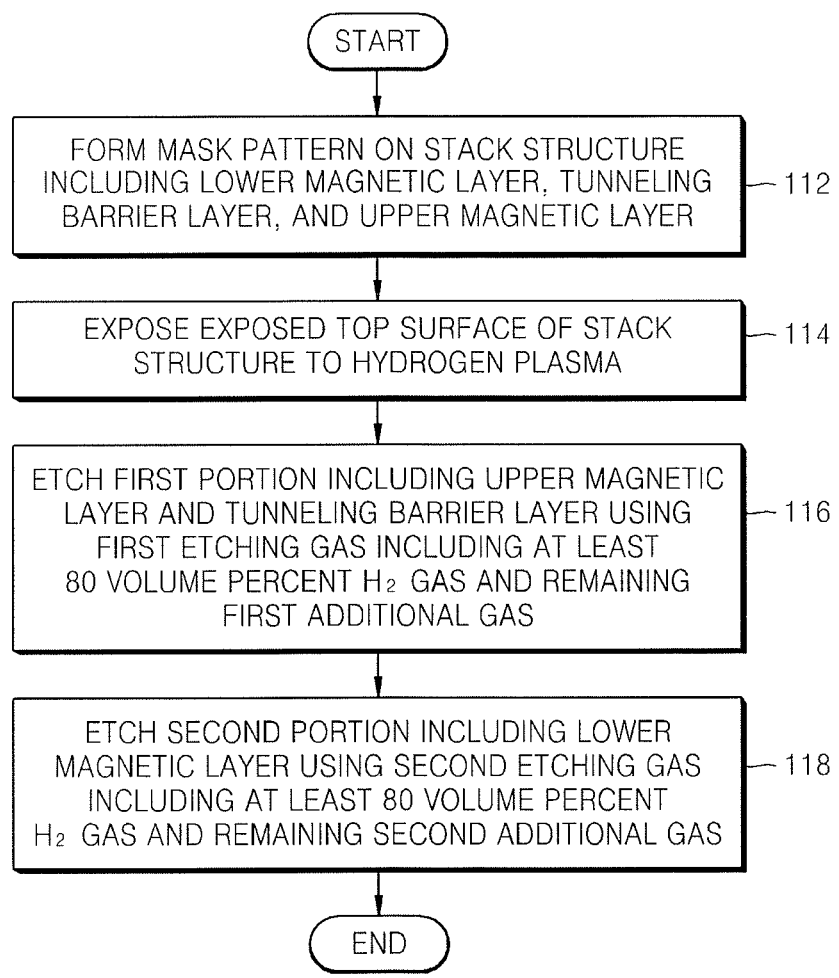
FIG. 11 illustrates a flowchart of a method of manufacturing a magnetic device, according to another exemplary embodiment of the inventive concept.

FIG. 11 is a flowchart of a method of manufacturing a magnetic device according to another exemplary embodiment of the inventive concept.

In operation 112 of FIG. 11, a mask pattern may be formed on a stack structure including a lower magnetic layer, a tunneling barrier layer, and an upper magnetic layer, which are sequentially stacked from bottom to top, to cover a portion of the stack structure.

In some embodiments, the stack structure may further include a lower electrode layer and an upper electrode layer which are formed under and on the lower magnetic layer, the tunneling barrier layer, and the upper magnetic layer interposed between the lower electrode layer and the upper electrode layer. The stack structure may include a magnetic layer formed of, e.g., at least one of Co/Pd, Co/Pt, Co/Ni, Fe/Pd, Fe/Pt, MgO, PtMn, IrMn, a CoFe alloy, and a CoFeB alloy. For example, the stack structure may include the stack structure 40 or 50 of FIG. 4 or 5.

The mask pattern may include at least one of, e.g., Ru, W, TiN, TaN, Ti, and Ta. In some embodiments, the mask pattern may have a bi-layer structure of, e.g., Ru\TiN or TiN\W.

In operation 114, a top surface of a resultant structure, i.e., a stack structure, of operation 112 may be exposed to hydrogen plasma to perform a pre-treatment of the stack structure. In some embodiments, in order to perform the pre-treatment process using hydrogen plasma, a structure including the stack structure may be loaded into the chamber 62 of the plasma etching apparatus 60, and hydrogen plasma is generated by supplying only $H_2$ gas into the chamber 62. A more detailed description of the pre-treatment process in operation 114 is substantially the same as the pre-treatment process described in operation 22 of FIG. 2. Thus, a detailed description thereof is omitted. If necessary, operation 114 may be omitted.

In operation 116, a first etching process of etching a first portion, including at least the upper magnetic layer and the tunneling barrier layer, from the exposed top surface of the stack structure may be performed using a first etching gas including at least 80% by volume of $H_2$ gas and a remainder of a first additional gas and by using the mask pattern formed in operation 112 as an etching mask.

In operation 116, the first etching process may be performed by a plasma etching process. In order to perform the first etching process, the plasma etching apparatus 60 illustrated in FIG. 6 may be used. The first etching process may be performed in the same chamber 62 and subsequent to the pre-treatment process of operation 114.

The first additional gas may include, e.g., at least one of an inert gas and $NH_3$ gas. For example, the first additional gas may include at least one of, e.g., $N_2$, Ne, Ar, Kr, or Xe.

While the first etching process is performed in operation 116, a source power and a bias power may be output in constant modes, as illustrated in FIGS. 7A and 7B, respectively. In some embodiments, while the first etching process is performed, a source power or a bias power may be output in a pulsed mode in which the source or bias power alternates between an on state and an off state, as illustrated in FIG. 7C or 7D. In some embodiments, while the first etching process is performed, in order to perform a synchronous pulse plasma etching process as illustrated in FIG. 7E, the source power in the pulsed mode and the bias power in the pulsed mode may be output simultaneously or with a predetermined time difference. The first etching process of operation 116 may be performed at a temperature of about (−10)° C. to about 65° C. under pressure of about 2 mTorr to about 5 mTorr.

When the stack structure 40 of FIG. 4 is etched in operation 116, after the first etching process is performed, the upper electrode layer 48, the upper magnetic layer 46, and the tunneling barrier layer 45 are separated into a plurality of upper electrodes, a plurality of upper magnetic patterns, and a plurality of tunneling barriers, respectively.

In operation 118, a second etching process of etching a second portion including the lower magnetic layer of the stack structure is performed using a second etching gas including at least 80% by volume of $H_2$ gas and a remainder of a second additional gas and by using the mask pattern as an etching mask. When the stack structure 40 of FIG. 4 is etched in operation 118, after the second etching process, the lower magnetic layer 44 and the lower electrode layer 42 are separated into a plurality of lower magnetic patterns and a plurality of lower electrodes.

The second etching process in operation 118 may be performed by a plasma etching process. In order to perform the second etching process, the plasma etching apparatus 60 illustrated in FIG. 6 may be used. The second etching process may be performed in the same chamber 62 as and subsequent to the first etching process of operation 116.

The second additional gas may include, e.g., at least one of an inert gas and $NH_3$ gas. The second additional gas may include, e.g., at least one of $N_2$, Ne, Ar, Kr, or Xe. In some embodiments, the second additional gas may include a different gas from the first additional gas used in operation 116. For example, $N_2$ gas may be used as the first additional gas in operation 116, and $NH_3$ gas may be used as the second additional gas in operation 118.

While the second etching process is performed in operation 118, in the plasma etching apparatus 60, a source power and a bias power may be output in constant wave modes, as illustrated in FIGS. 7A and 7B, respectively. In some embodiments, while the second etching process is performed, a source power or a bias power may be output in a pulsed mode in which the source or bias power alternates between an on state and an off state, as illustrated in FIG. 7C or 7D. In some embodiments, while the second etching process is performed, in order to perform a synchronous pulse plasma etching process, the source power in the pulsed mode and the bias power in the pulsed mode, as illustrated in FIG. 7E, may be output simultaneously or with a predetermined time difference. The second etching process of operation 118 may be performed at a temperature of about (−10)° C. to about 65° C. under pressure of about 2 mTorr to about 5 mTorr.

In some embodiments, an output mode of each of the source power and the bias power for the second etching process of operation 118 may be set differently from an output mode of each of the source power and the bias power for the first etching process of operation 116. For example, when the first etching process is performed in operation 116, the source power and the bias power may be output in the constant wave modes, as illustrated in FIGS. 7A and 7B, respectively, and when the second etching process is performed in operation 118, the source power in the pulsed mode and the bias power in the pulsed mode, as illustrated in FIG. 7E, may be output so as to perform the synchronous pulse plasma etching process.

The second etching process of operation 118 may be performed in the synchronous pulse plasma etching process condition so that accelerated ions generated from the etching gas are moved in the increased movement range and collide with the region to be etched. In the region to be etched of the stack structure, a chemical reaction with the accelerated hydrogen ions that reach the surface of the region is performed. Simultaneously, physical etching due to the accelerated ions obtained from the second additional gas may be uniformly performed in the region to be etched. Thus, the hydrogen ions and the accelerated ions generated from the second additional gas may be more effectively used in performing high anisotropic etching of a layer to be etched and removing of a re-deposited layer. As a result, fine magnetic resistive devices, each having a vertical sidewall profile, may be easily formed, and by-products may be prevented from being re-deposited on the sidewalls of the patterns obtained after etching. Thus, an additional cleaning process or a post-treatment process for removing the re-deposited etching by-products is not performed.

FIGS. 12A through 12H are cross-sectional views of stages in a method of manufacturing a magnetic device 200 (see FIG. 12H), according to another exemplary embodiment of the inventive concept. The present embodiment illustrates a process of manufacturing a spin transfer torque magnetoresistive random access memory (STT-MRAM) device as a process of manufacturing the magnetic device 200.

Figure 12A:
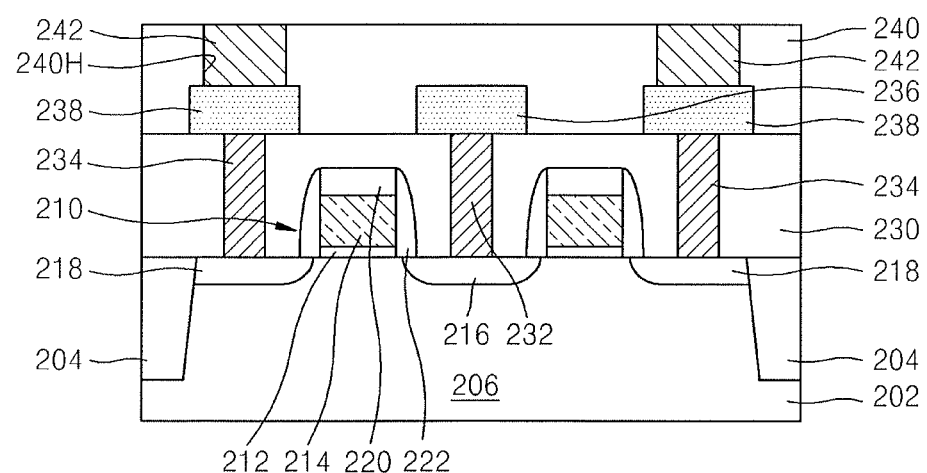
FIGS. 12A through 12H illustrate cross-sectional views of stages in a method of manufacturing a magnetic device according to another exemplary embodiment of the inventive concept.

Referring to FIG. 12A, an isolation layer 204 may be formed on a substrate 202 to define an active region 206. At least one transistor 210 may be formed in the active region 206.

In some embodiments, the substrate 202 may be a semiconductor wafer. In at least one embodiment, the substrate 202 may include, e.g., silicon (Si). In some embodiments, the substrate 202 may include a semiconductor element, e.g., Ge, or a compound semiconductor, e.g., SiC, GaAs, InAs, or InP. In at least one embodiment, the substrate 202 may have a silicon on insulator (SOI) structure. For example, the substrate 202 may include a buried oxide (BOX) layer. In some embodiments, the substrate 202 may include a conductive region, e.g., a well doped with an impurity, or a structure doped with an impurity. The isolation layer 204 may have a shallow trench isolation (STI) structure.

The transistor 210 may include a gate insulating layer 212, a gate electrode 214, a source region 216, and a drain region 218. The gate electrode 214 may be formed such that a top surface and both sidewalls of the gate electrode 214 are insulated by an insulating capping layer 220 and an insulating spacer 222, respectively.

Next, a planarized first interlayer insulating layer 230 for covering the transistor 210, a plurality of first contact plugs 232 that penetrate the first interlayer insulating layer 230 and are electrically connected to the source region 216, and a plurality of second contact plugs 234 that are electrically connected to the drain region 218 may be formed sequentially on the substrate 202. After a conductive layer is formed on the first interlayer insulating layer 230, the conductive layer may be patterned, thereby forming a plurality of source lines 236 that are electrically connected to the source region 216 via the plurality of first contact plugs 232 and a plurality of conductive patterns 238 that are electrically connected to the drain region 218 via the plurality of second contact plugs 234 at both sides of the source lines 236.

Next, a second interlayer insulating layer 240 may be formed on the first interlayer insulating layer 230 to cover the source lines 236 and the conductive patterns 238. By using a photolithographic process, a portion of the second interlayer insulating layer 240 may be removed to expose a top surface of the conductive patterns 238, thereby forming a lower electrode contact hole 240H. By filling a conductive material in the lower electrode contact hole 240H and by polishing the conductive material to expose a top surface of the second interlayer insulating layer 240, a lower electrode contact plug 242 may be formed in the lower electrode contact hole 240H. In some embodiments, the lower electrode contact plug 242 may include, e.g., at least one of TiN, Ti, TaN, Ta, or W.

Figure 12B:
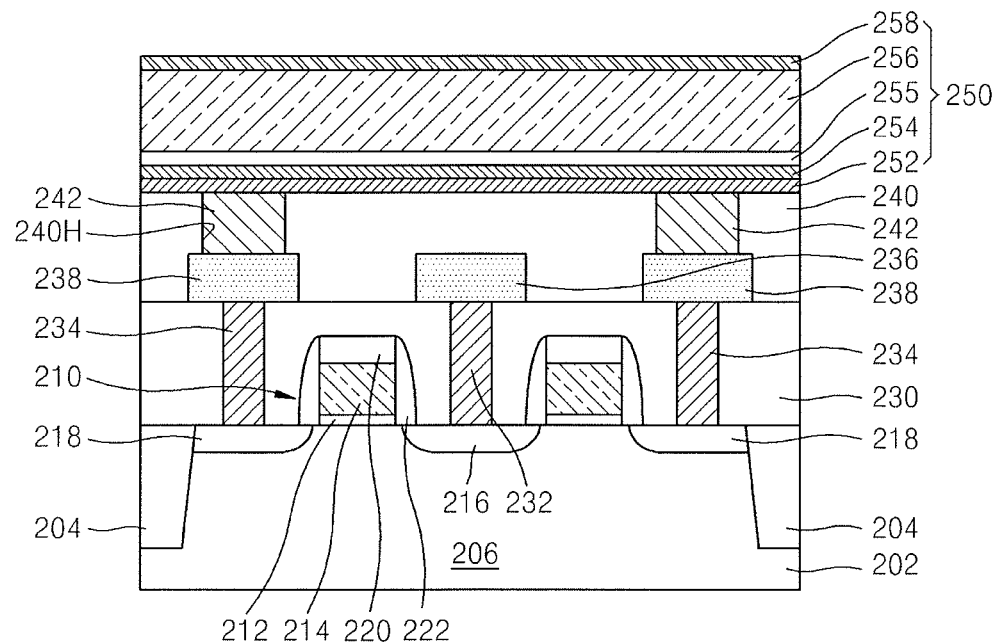

Referring to FIG. 12B, a stack structure 250, in which a lower electrode layer 252, a lower magnetic layer 254, a tunneling barrier layer 255, an upper magnetic layer 256, and an upper electrode layer 258 are sequentially stacked from bottom to top, may be formed on the second interlayer insulating layer 240 and the lower electrode contact plug 242.

The stack structure 250 may include the stack structure 40 or 50 of FIG. 4 or 5. However, aspects of the inventive concept are not limited thereto, and various types of layers may be added or replaced according to desired characteristics of a magnetic device to be formed.

Figure 12C:
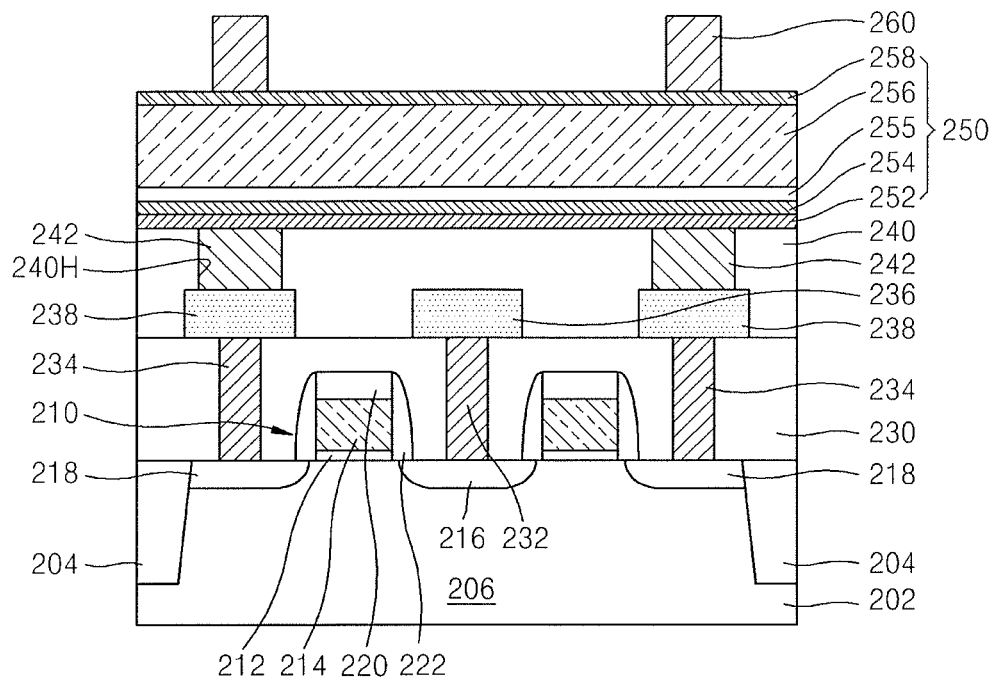

Referring to FIG. 12C, a plurality of conductive mask patterns 260 are formed on the stack structure 250 so as to cover a portion of a top surface of the stack structure 250. The plurality of conductive mask patterns 260 may include metal or metal nitride. In some embodiments, the plurality of conductive mask patterns 260 may include, e.g., at least of Ru, W, TiN, TaN, Ti, and Ta. For example, the conductive mask patterns 260 may have a bi-layer structure of Ru\TiN or TiN\W. The conductive mask patterns 260 may be formed on the same axis as that of the lower electrode contact plugs 242, e.g., the conductive mask patterns 260 may be aligned with the lower electrode contact plugs 242 along a vertical axis normal to the substrate 202.

In some embodiments, in order to form the plurality of conductive mask patterns 260, a conductive mask layer may first be formed on the stack structure 250, and a plurality of hard mask patterns (not shown) may be formed on the conductive mask layer. The conductive mask layer may be etched using the plurality of hard mask patterns as an etching mask so that the plurality of conductive mask patterns 260 may remain on the stack structure 250.

Figure 12D:
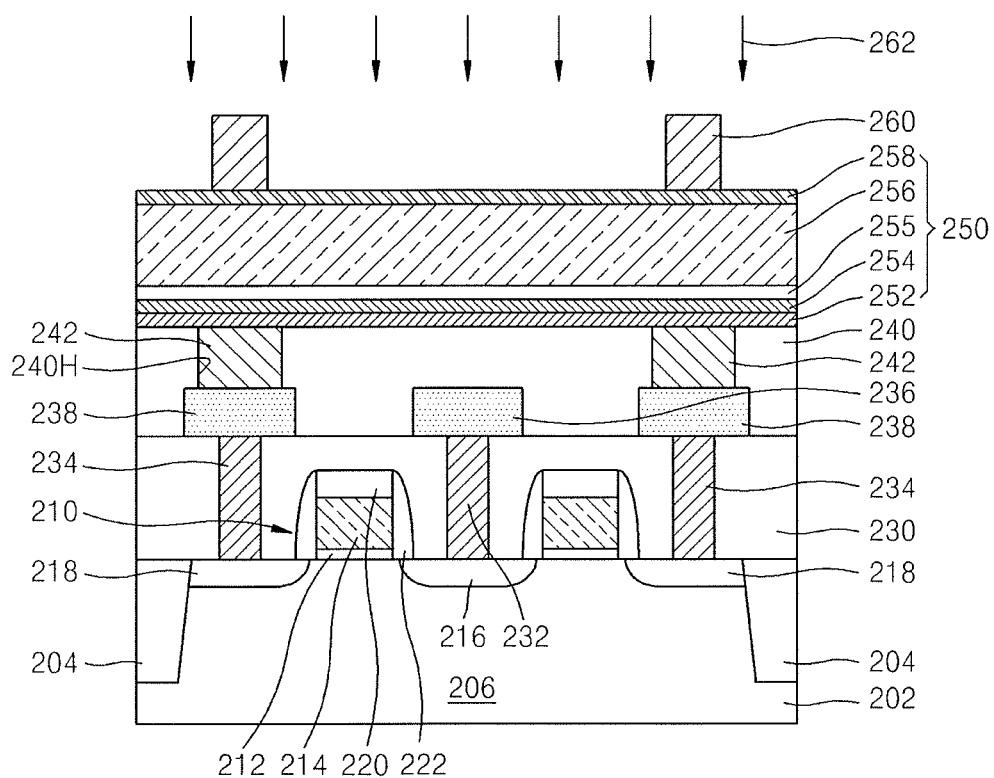

Referring to FIG. 12D, an exposed top surface of the stack structure 250 may be exposed to hydrogen plasma 262 through the conductive mask patterns 260 to perform pre-treatment of the exposed top surface of the stack structure 250. The pre-treatment process using the hydrogen plasma 262 is the same as operation 22 of FIG. 2 and the pre-treatment process using hydrogen plasma described with reference to FIGS. 8B and 9B. The pre-treatment process using the hydrogen plasma 262 may be omitted if necessary.

Figure 12E:
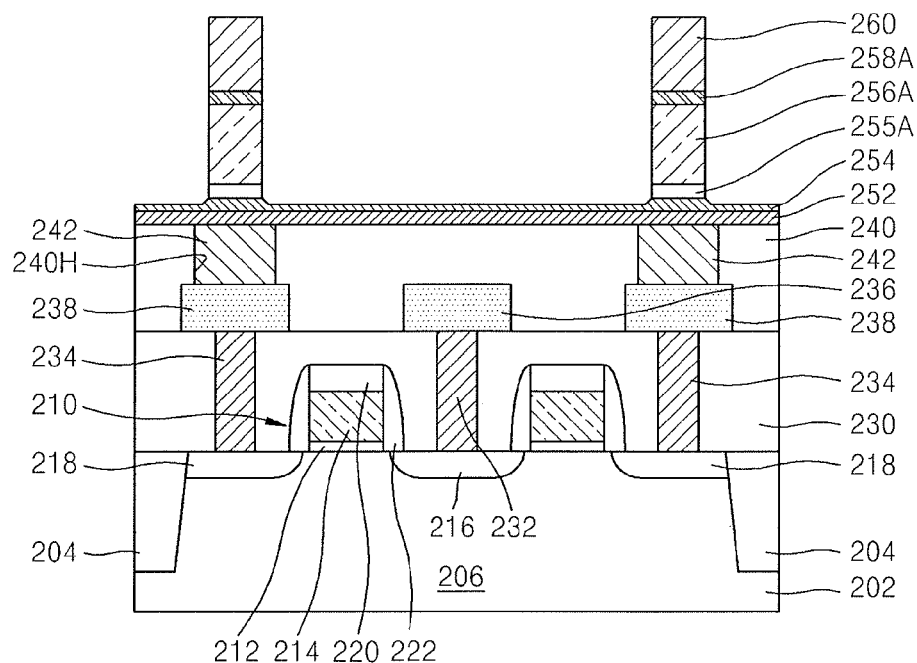

Referring to FIG. 12E, a first etching process of etching the upper electrode layer 258, the upper magnetic layer 256, and the tunneling barrier layer 255 by using a plasma etching process may be performed by using a first etching gas including at least 80% by volume of $H_2$ gas and a remainder of a first additional gas and by using the conductive mask patterns 260 as an etching mask. As a result, a plurality of upper electrodes 258A, a plurality of upper magnetic layer patterns 256A, and a plurality of tunneling barrier layers 255A may be formed. The first etching process of FIG. 12E is substantially the same as operation 116 of FIG. 11. While the first etching process is performed, a portion of the plurality of conductive mask patterns 260 may be consumed from their top surfaces due to an etching atmosphere of the first etching process.

While the first etching process is performed, the lower magnetic layer 254 exposed after the plurality of tunneling barrier layers 255A are formed may be further etched from its top surface by a predetermined thickness to thus complete the first etching process. In some embodiments, in order to determine an end point of the first etching process, optical emission spectroscopy may be used. In order to perform the first etching process by setting the lower magnetic layer 254 as the end point, the first etching process may be performed until an emission wavelength of one of the elements of the lower magnetic layer 254 is detected in the optical emission spectroscopy.

In some embodiments, the first etching process may be performed in a state where a source power and a bias power applied to constitute the etching atmosphere of the first etching process are output in the constant wave modes, as illustrated in FIGS. 7A and 7B, respectively.

Figure 12F:
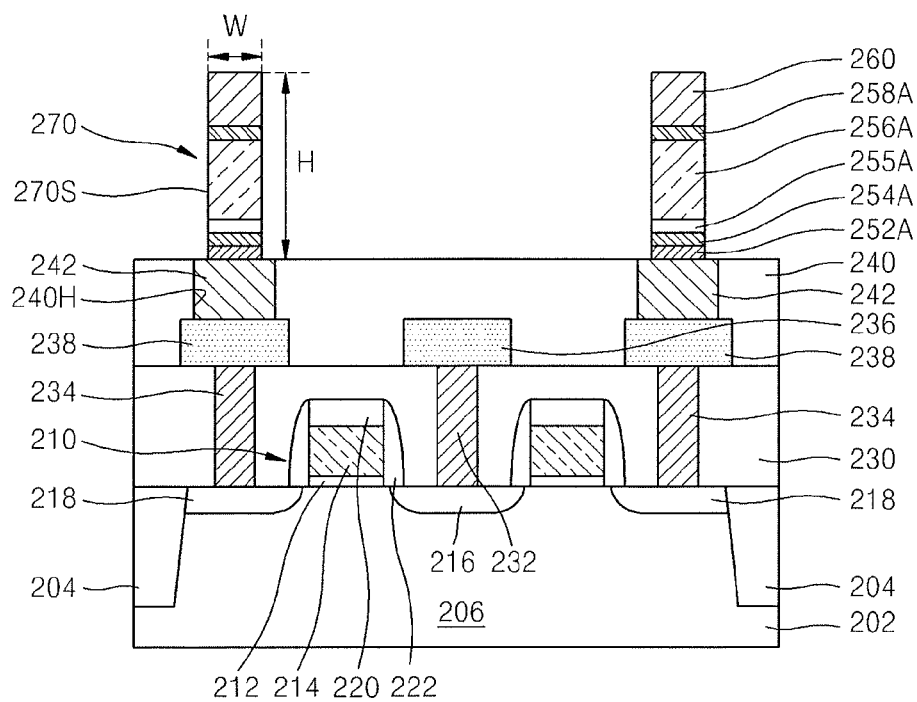

Referring to FIG. 12F, a second etching process of etching the lower magnetic layer 254 exposed between the plurality of conductive mask patterns 260, and the lower electrode layer 252 under the lower magnetic layer 254 of the stack structure 250 (see FIG. 12B) may be performed using a second etching gas including at least 80% by volume of H2 gas and a remainder of a second additional gas and by using the conductive mask patterns 260 as an etching mask. As a result, a plurality of lower magnetic layer patterns 254A and a plurality of lower electrodes 252A may be formed. The second etching process of FIG. 12F is substantially the same as operation 118 of FIG. 11.

In some embodiments, about 80% by volume to about 95% by volume of $H_2$ gas and about 5% by volume to about 20% by volume of the second additional gas may be used as the second etching gas. The second additional gas may include, e.g., at least one of $N_2$, $NH_3$, Ne, Ar, Kr, or Xe. In some embodiments, the second additional gas includes a different gas from the first additional gas. For example, when $N_2$ gas is used as the first additional gas, $NH_3$ may be used as the second additional gas.

The second etching process may be performed in an atmosphere in which ion energy that is higher than about 500 eV and plasma density that is lower than about $1 \times 1011$ cm$^{-3}$ are maintained. The second etching process may be performed at a temperature of about (−10)° C. to about 65° C. under pressure of about 2 mTorr to about 5 mTorr. While the second etching process is performed, a portion of the plurality of conductive mask patterns 260 may be consumed from their top surfaces due to an etching atmosphere of the second etching process. Although not shown, when the second etching process is performed, the second interlayer insulating layer 240 exposed after the plurality of lower electrodes 252A are formed may be etched from its top surface by a predetermined thickness.

As a resultant structure of the second etching process, a plurality of magnetic resistive devices 270 including the lower electrodes 252A, the lower magnetic layer patterns 254A, the tunneling barrier layers 255A, the upper magnetic layer patterns 256A, the upper electrodes 258A, and the remaining conductive mask pattern portions 260 are formed on the plurality of lower electrode contact plugs 242. In the plurality of magnetic resistive devices 270, the remaining conductive mask pattern portions 260 and the upper electrodes 258A serve as one electrode.

The plurality of magnetic resistive devices 270 may be obtained by performing the first etching process of FIG. 12E and the second etching process of FIG. 12F, each using the etching gas including at least 80% by volume of $H_2$ gas. The plurality of magnetic resistive devices 270 may have sidewalls 270S with a substantially vertical sidewall profile, i.e., the sidewalls 270 may substantially extend along a normal to the substrate 202 without slopes, e.g., inclines, or by-product build-up thereon. That is, while the first etching process of FIG. 12E and the second etching process of FIG. 12F are performed, etching residuals, e.g., non-volatile materials, may be prevented from being re-deposited on the sidewalls 270S of the magnetic resistive devices 270. Thus, deterioration of characteristics of the magnetic resistive devices 270 due to by-products re-deposited on the sidewalls 270S may be prevented, and an additional cleaning process or a post-treatment process for removing re-deposited by-products from the sidewalls 270S may be eliminated, thereby simplifying the process of manufacturing the magnetic resistive devices 270.

In addition, even when a width W of each of the plurality of magnetic resistive devices 270 has a very fine size of several tens of nm, e.g., about 20 nm, high anisotropic etching may be performed on the stack structure 250 without re-deposition of the etching by-products. Therefore, fine magnetic devices having a large aspect ratio, each having a vertical sidewall profile, may be easily manufactured.

In some embodiments, a height H of each magnetic resistive device 270 is at least 1.5 times a width W of the magnetic resistive device 270. For example, the height H of the magnetic resistive device 270 may be about 1.5 times to about 3.5 times the width W of the magnetic resistive device 270. In some embodiments, a width of the tunneling barrier layer 255A may be set as a base for the width W of the magnetic resistive device 270. In this regard, the height H of the magnetic resistive device 270 may be at least 1.5 times the width of the tunneling barrier layer 255A.

Figure 12G:
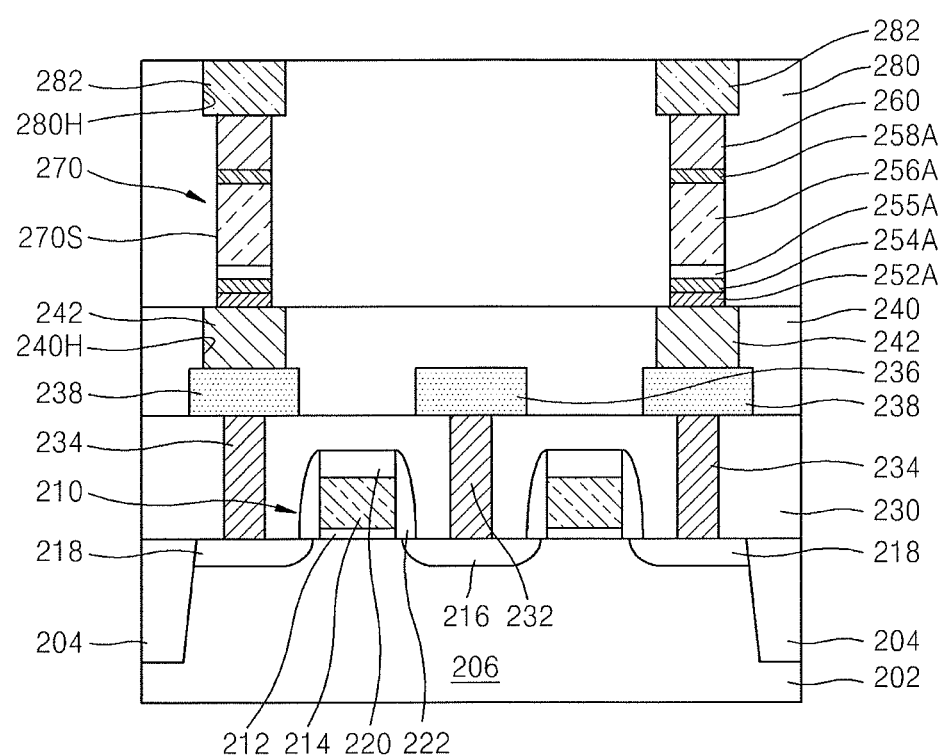

Referring to FIG. 12G, a planarized third interlayer insulating layer 280 may be formed to cover the plurality of magnetic resistive devices 270, and a portion of the third interlayer insulating layer 280 may be removed by etching to form a plurality of bit line contact holes 280H that expose a top surface of the conductive mask pattern 260 of each magnetic resistive device 270. Next, after a conductive layer for filling the plurality of bit line contact holes 280H is formed, the conductive layer may be polished or etched until a top surface of the third interlayer insulating layer 280 is exposed, thereby forming a plurality of bit line contact plugs 282 in the plurality of bit line contact holes 280H, respectively.

Figure 12H:
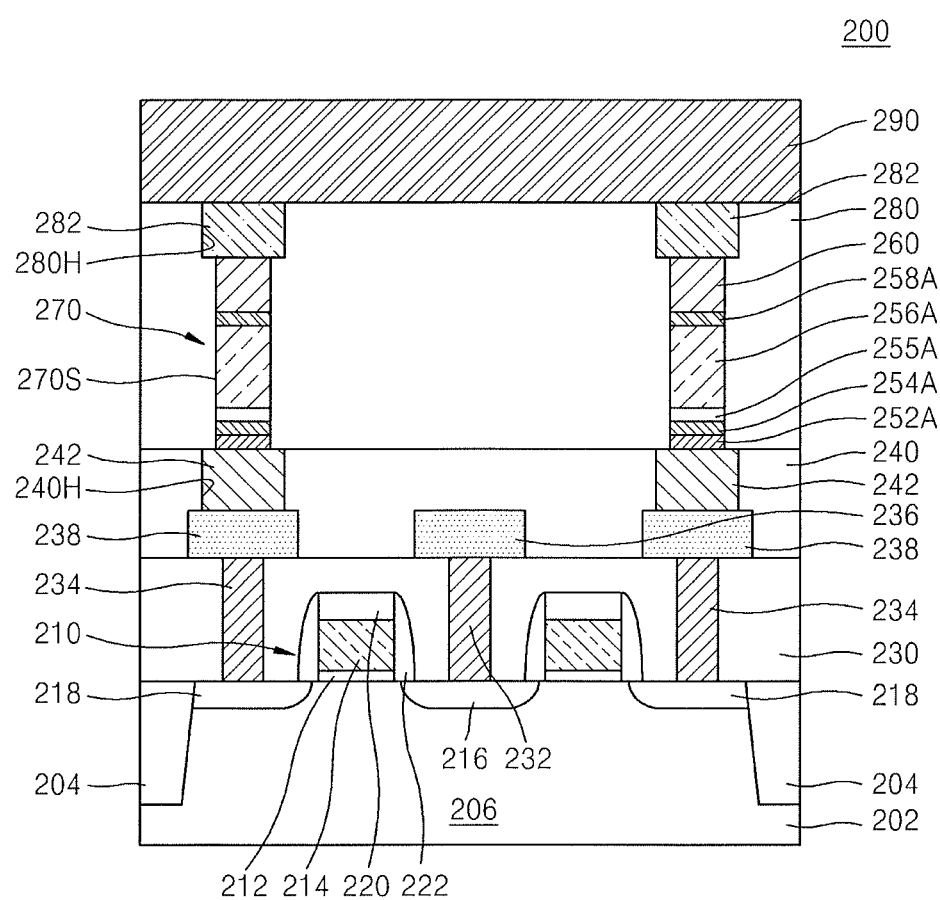

Referring to FIG. 12H, a conductive layer may be formed on the third interlayer insulating layer 280 and the plurality of bit line contact plugs 282 and may be patterned, thereby forming bit lines 290, e.g., having a linear shape, that are electrically connected to the plurality of bit line contact plugs 282, respectively, to form the magnetic device 200.

Figure 13:
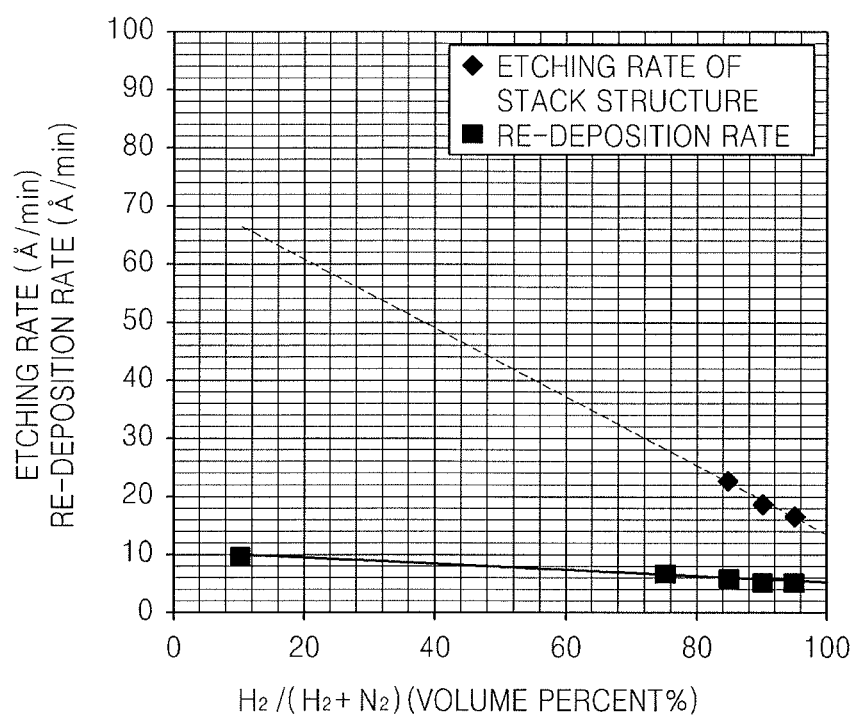
FIG. 13 illustrates a graph showing dependency of etching and re-deposition rates on concentration of $H_2$ gas in an etching gas.

FIG. 13 is a graph showing an evaluation result of etching and re-deposition rates of a stack structure including a magnetic layer according to embodiments as a function of $H_2$ concentration in the etching gas according to an embodiment of the inventive concept.

For the evaluation of FIG. 13, a stack structure of Ti (20 Å) \Ru (20 Å) \Ta (4 Å) \CoFeB (11 Å) \MgO (10 Å) \CoFeB (12 Å) \Ta (4 Å) \Co (5 Å) \Pt (10 Å) \[Co (2.5 Å) \Pd (10 Å)]×3\Co (5 Å) \Ru (8 Å) \Co (5 Å) \[Pd (10 Å) \Co (2.5 Å)]×7\Pd (10 Å) \Ti (10 Å) \Ru (50 Å), which are sequentially stacked from bottom to top, was used. In order to etch the stack structure, conductive mask patterns having a structure of Ru (500 Å)\TiN (600 Å) were formed on the stack structure, and the stack structure was etched using the conductive mask patterns as an etching mask. Samples for the evaluation were plasma etched using an etching gas in various conditions shown in FIG. 13. A process temperature, a process pressure, a source power, and a bias power for etching were set to 230° C., 2 mTorr, 500 W, and 350 W, respectively. As seen in FIG. 13, as concentration of $H_2$ gas in the etching gas increased, the re-deposition rate of by-products on sidewalls decreased.

Figure 14:
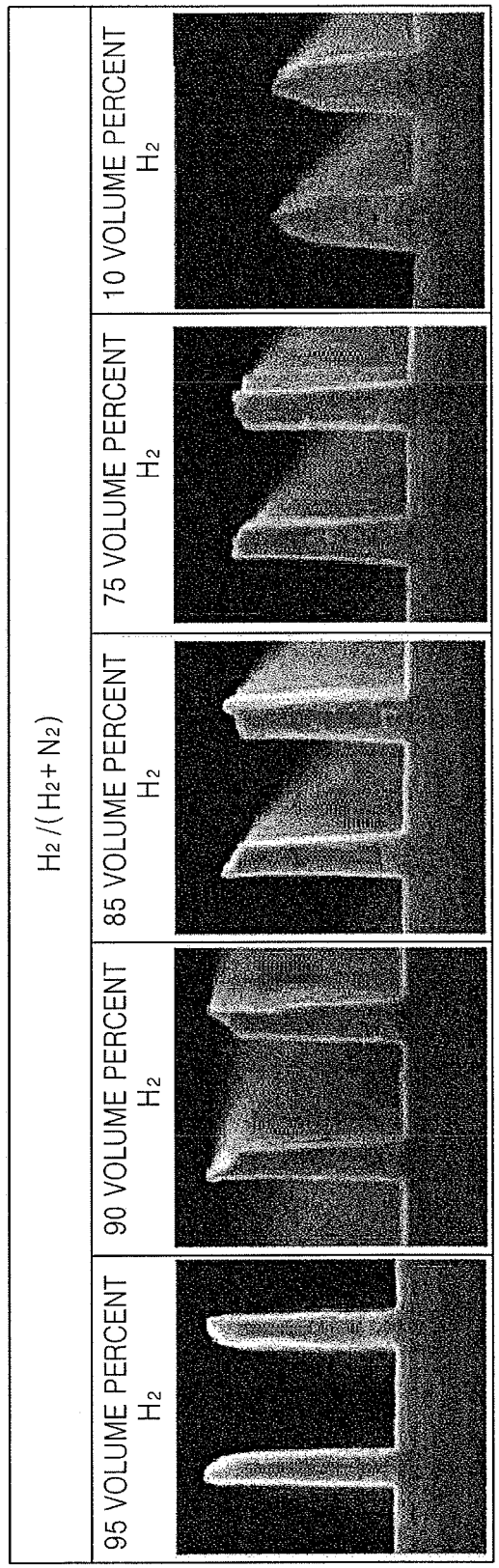
FIG. 14 illustrates virtual scanning electron microscope (VSEM) photographs of etched stack structures in accordance with different concentrations of $H_2$ gas in an etching gas according to an embodiment of the inventive concept.

FIG. 14 illustrates virtual scanning electron microscope (VSEM) photographs of an evaluation result of dependency of a stack structure including a magnetic layer according to embodiments with respect to $H_2$ gas concentration in the etching gas according to an embodiment of the inventive concept.

For the evaluation of FIG. 14, the stack structure and the conductive mask patterns that are used in the evaluation of FIG. 13 were used, and the same etching atmosphere condition was used. FIG. 14 shows resultant structures formed by etching the stack structure from its top surface to an MgO layer, i.e., a tunneling barrier layer, in the etching condition described above. As seen in FIG. 14, when concentration of $H_2$ gas in the etching gas was 80% by volume or more, sidewalls of an etched pattern had a vertical profile and re-deposition of by-products was prevented.

Figure 15:
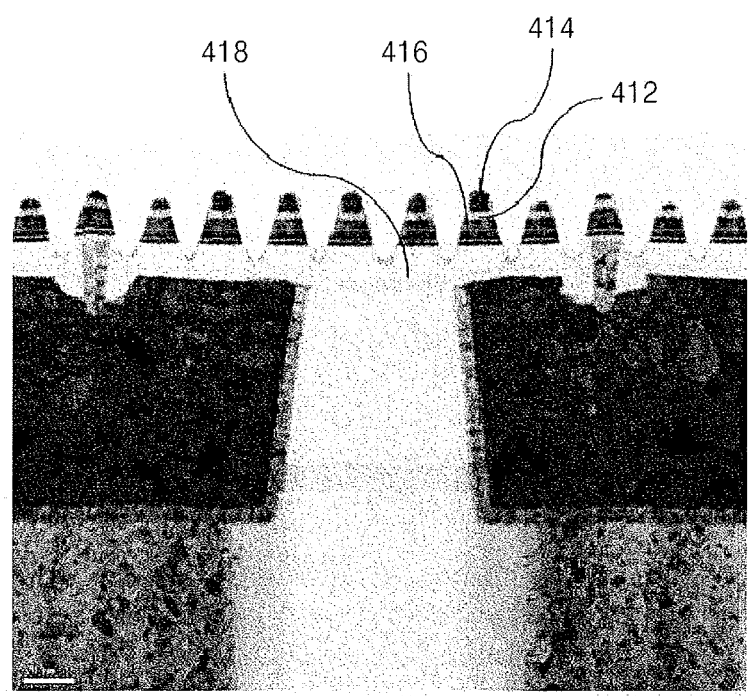
FIG. 15 illustrates a VSEM photograph showing a resultant structure formed by etching a stack structure including a magnetic layer by using a method of manufacturing a magnetic device, according to an embodiment of the inventive concept.

FIG. 15 illustrates a VSEM photograph of a structure formed by etching a stack structure including a magnetic layer by using a method of manufacturing a magnetic device according to an embodiment of the inventive concept.

For the evaluation of FIG. 15, a stack structure of Ti (20 Å) \Ru (20 Å) \Ta (4 Å) \CoFeB (11 Å) \MgO (10 Å) \CoFeB (12 Å) \Ta (4 Å) \Co (5 Å) \Pt (10 Å) \[Co (2.5 Å) \Pd (10 Å)]×3\Ru (8 Å) \CoPt (80 Å) \Ru (50 Å), which are sequentially stacked from bottom to top, was used. In order to etch the stack structure, conductive mask patterns having a structure of TiN (100 Å) \W (600 Å) were formed on the stack structure, and the stack structure was etched using the conductive mask patterns as an etching mask.

In order to etch the stack structure, a first etching process was performed from the Ru layer, i.e., an upper electrode, to the MgO layer, i.e., the tunneling barrier layer, by using plasma obtained from a first etching gas including 90% by volume of $H_2$ gas and 10% by volume of $N_2$ gas. A process temperature, a process pressure, a source power, and a bias power for the first etching process were 60° C., 2 mTorr, 350 W, and 600 W, respectively. In the first etching process, a bias power in a constant wave mode was applied. Next, a second etching process was performed from the CoFeB layer to a Ti layer that is a lower electrode, by using plasma obtained from a second etching gas including 80% by volume of $H_2$ gas and 20% by volume of $NH_3$ gas. A process temperature, a process pressure, a source power, and a bias power for the second etching process were 60° C., 2 mTorr, 750 W, and 340 W, respectively. In the second etching process, a bias power in a pulsed mode was applied. As a result, a plurality of MTJ devices shown in FIG. 15 were obtained.

In the photograph of FIG. 15, reference numerals 412 and 414 denote a TiN layer and a W layer, respectively, each of which is used as an etching mask, and reference numeral 416 denotes an MgO layer that is a tunneling barrier layer, and reference numeral 418 denotes an interlayer insulating layer. In the plurality of MTJ devices, which are shown in the VSEM photograph of FIG. 15, obtained through the first etching process and the second etching process, a ratio of an average height with respect to an average width was about 1:1.5.

Figure 16:
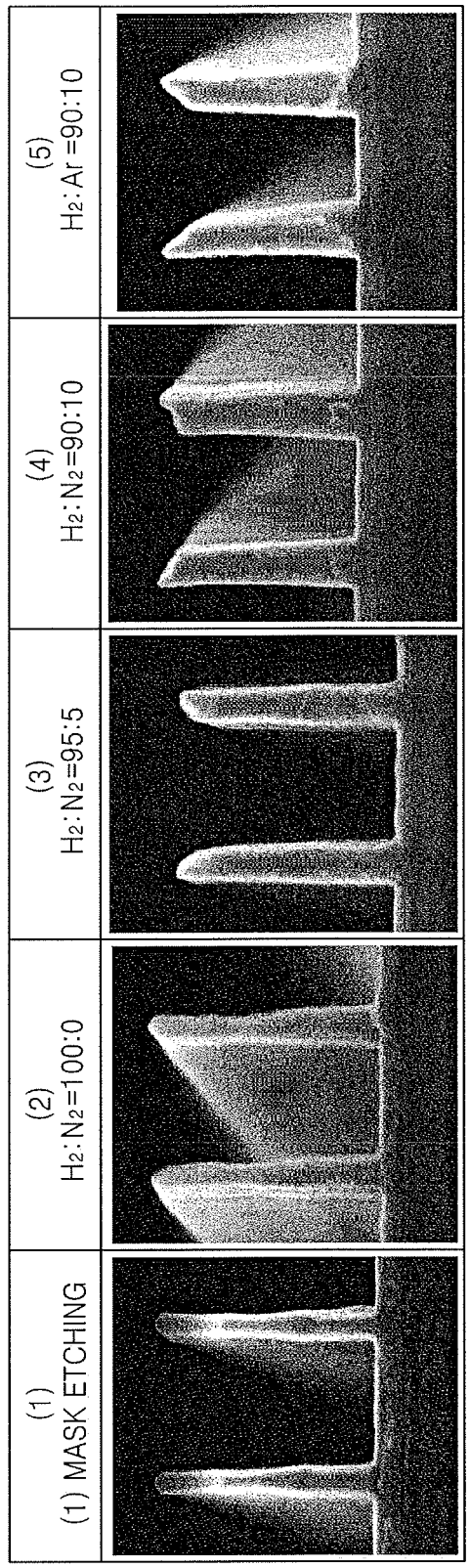
FIG. 16 illustrates VSEM photographs of etched stack structures in accordance with different ratios and concentrations of $H_2$ gas in an etching gas used on a stack structure including a magnetic layer, according to an embodiment of the inventive concept.

FIG. 16 illustrates VSEM photographs showing an evaluation result of stack structures with respect to different concentrations of $H_2$ gas in the etching gas used on the stack structure including the magnetic layer according to an embodiment of the inventive concept.

For the evaluation of FIG. 16, a stack structure of Ti (20 Å) \Ru (20 Å) \Ta (4 Å) \CoFeB (11 Å) \MgO (10 Å) \CoFeB (12 Å) \Ta (4 Å) \Co (5 Å) \Pt (10 Å) \[Co (2.5 Å) \Pd (10 Å)]×3\Ru (8 Å) \[Co (2.5 Å) \Pd (10 Å)]×7\Ru (50 Å), which are sequentially stacked from bottom to top, was used. In order to etch the stack structure, conductive mask patterns having a structure of Ru (500 Å)\TiN (600 Å) were formed on the stack structure, and a plurality of MTJ devices were manufactured by etching the stack structure by using the conductive mask patterns as an etching mask.

Samples for the evaluation were anisotropically etched using plasma obtained from an etching gas having various compositions shown in FIG. 16. While the stack structure was etched, a composition and a composition ratio of the etching gas were the same, and a process temperature, a process pressure, a source power, and a bias power for etching were set to 60° C., 2 mTorr, 350 W, and 600 W, respectively.

In FIG. 16, (1) is a photograph showing the stack structure before it is etched, after the conductive mask patterns having the structure of Ru (500 Å)\TiN (600 Å) were formed on the stack structure. (2) is a photograph showing a resultant structure in which the stack structure is not etched, as a result of etching the stack structure using plasma obtained from an etching gas including 100% $H_2$ gas. (3) is a photograph showing a resultant structure formed by etching the stack structure by using plasma obtained from an etching gas including 95% by volume of $H_2$ gas and 5% by volume of $N_2$ gas. (4) is a photograph showing a resultant structure formed by etching the stack structure by using plasma obtained from an etching gas including 90% by volume of $H_2$ gas and 10% by volume of $N_2$ gas. (5) is a photograph showing a resultant structure formed by etching the stack structure by using plasma obtained from an etching gas including 90% by volume of $H_2$ gas and 10% by volume of Ar gas.

In photographs (3), (4), and (5) of FIG. 16, the stack structure was high-anisotropically etched without re-deposition of etching by-products. Comparing photograph (2), i.e., where the stack structure is etched using only $H_2$ gas, and photographs (3), (4), and (5), i.e., where the stack structure is etched using an etching gas including added $N_2$ gas or Ar gas that is non-volatile gas, $H_2$ gas in the etching gas is used to chemically etch the stack structure. In addition, comparing photographs (4) and (5), a profile of the obtained MTJ devices is similar. Thus, the $N_2$ gas used as an additional gas in photograph (4) and the Ar gas used as an additional gas in photograph (5) perform the same operation.

In each MTJ device shown in the VSEM photograph (3) of FIG. 16, a ratio of a height with respect to a width was 1:4. In each MTJ device shown in the VSEM photo of photograph (4) of FIG. 16, a ratio of the height with respect to the width was 1:3.5.

Figure 17A:
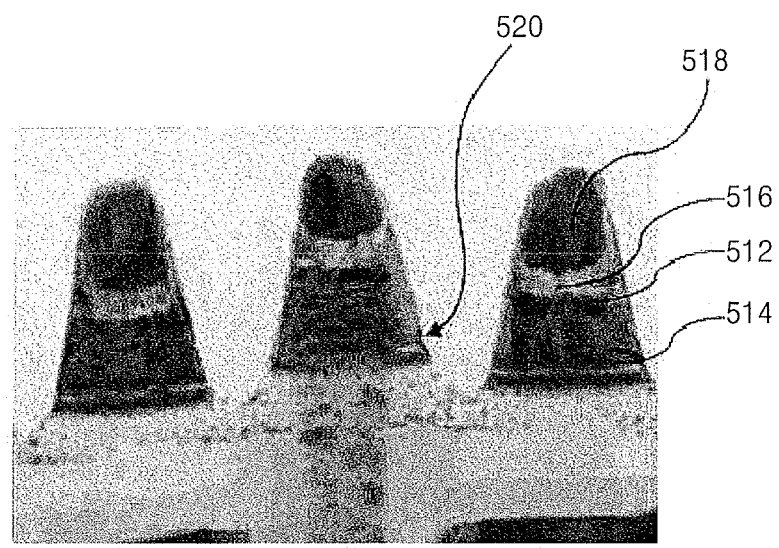
FIGS. 17A and 17B are VSEM photographs illustrating a resultant structure formed by evaluating the effect when a pulsed bias power is applied when a stack structure including a magnetic layer is etched by using a method of manufacturing a magnetic device, according to an embodiment of the inventive concept.
Figure 17B:
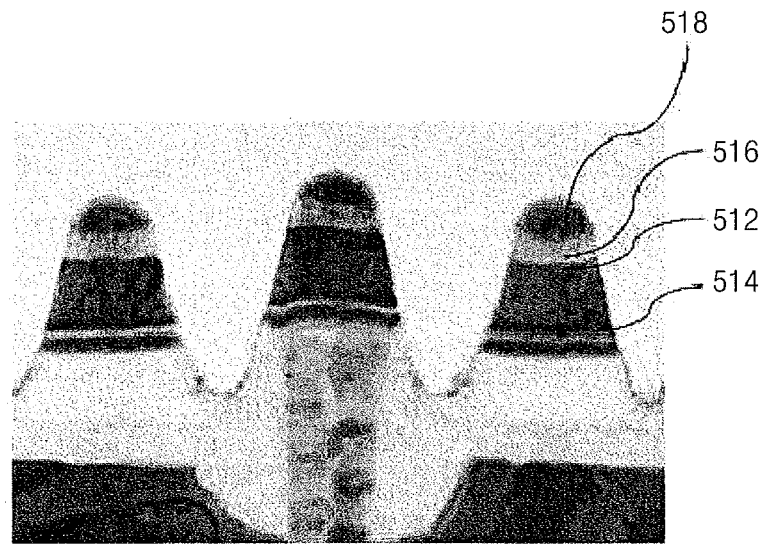

FIGS. 17A and 17B are VSEM photographs showing a resultant structure formed by evaluating the effect when a pulsed bias power is applied when a stack structure including a magnetic layer is etched by using a method of manufacturing a magnetic device according to an embodiment of the inventive concept.

For the evaluation of FIGS. 17A and 17B, the stack structure and the mask pattern structure used in evaluation of FIG. 15 were used, and the same etching atmosphere condition was used.

FIG. 17A is a photograph showing a result of performing a first etching process of etching the stack structure from a Ru layer 512 that is an upper electrode to an MgO layer 514 that is a tunneling barrier layer, by applying a bias power in a constant wave mode. FIG. 17B is a photograph showing a result of performing a second etching process of etching the stack structure from a CoFeB layer that is a lower structure of the MgO layer 514 to a Ti layer that is a lower electrode, by applying a bias power in a pulsed mode. In FIGS. 17A and 17B, reference numerals 516 and 518 denote a TiN layer and a W layer, which are used as an etching mask, respectively.

In the photograph of FIG. 17A, i.e., showing the case where the first etching process is performed up to the MgO layer 514 when applying the bias power in the constant wave mode, a small amount of etching residuals 520 were attached to sidewalls of the MgO layer 514 exposed after the first etching process. In the photograph of FIG. 17B, i.e., showing the result of performing the second etching process on the resultant structure of FIG. 17A by applying the bias power in the pulsed mode, the etching residuals 520 were removed from the sidewalls of the MgO layer 514, and the sidewalls of the MgO layer 514 were fully exposed. In the plurality of MTJ devices, which are shown in the VSEM photograph of FIG. 17B, i.e., obtained through the second etching process, a ratio of an average height with respect to an average width was about 1:1.5.

Figure 18:
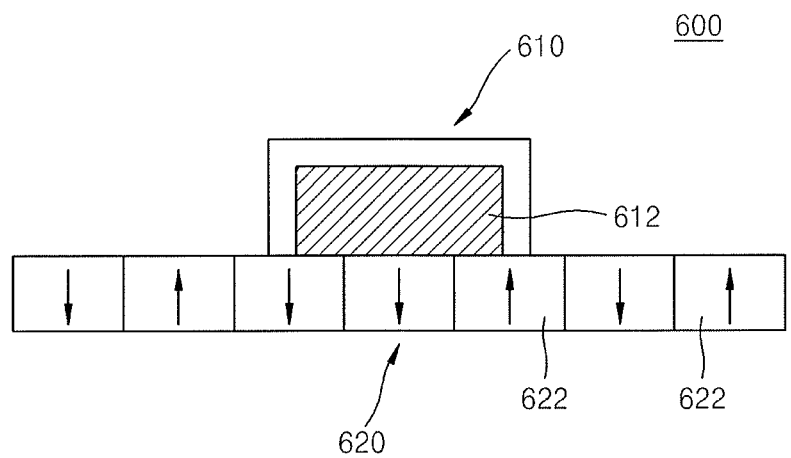
FIG. 18 illustrates a schematic cross-sectional view of a magnetic device that may be implemented by using a method of manufacturing a magnetic device, according to an embodiment of the inventive concept.

FIG. 18 is a schematic cross-sectional view of a magnetic device 600 formed by using a method of manufacturing a magnetic device according to an embodiment of the inventive concept. Referring to FIG. 18, the magnetic device 600 may include a recording head 610 of a hard disk drive (HDD). The recording head 610 may include an MTJ device 612.

Data is recorded in each domain 622 of a recording medium 620 due to perpendicular magnetic polarization, as indicated by arrows. The recording head 610 may record data on the recording medium 620 or may read recorded data from the recording medium 620. The method of manufacturing a magnetic device, according to the inventive concept, may apply to forming the MTJ device 612 of the recording head 610.

Figure 19:
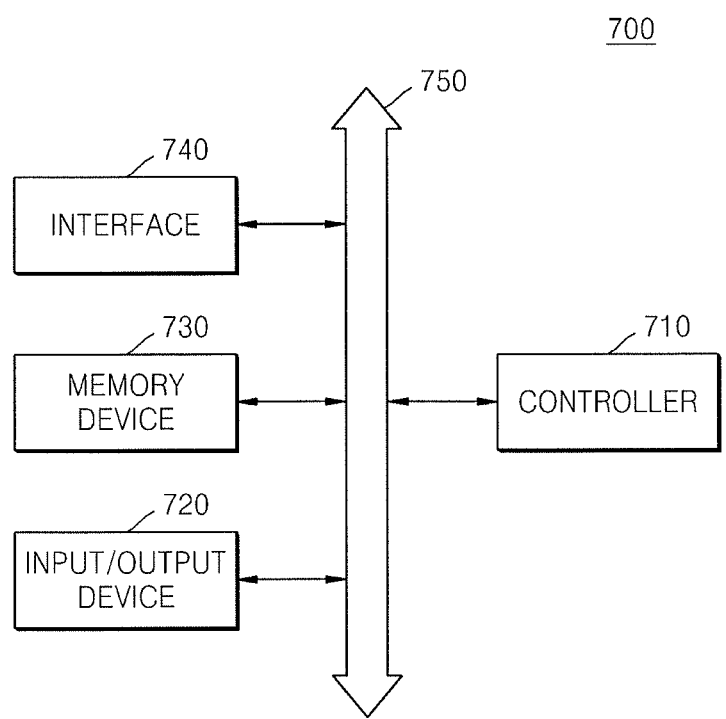
FIG. 19 illustrates a system that may be implemented by using a method of manufacturing a magnetic device, according to an embodiment of the inventive concept.

FIG. 19 illustrates a system 700 that may be implemented by using a method of manufacturing a magnetic device according to an embodiment of the inventive concept. Referring to FIG. 19, the system 700 may include a controller 710, an input/output device 720, a memory device 730, and an interface 740. The system 700 may be a mobile system or a system for transmitting or receiving information. In some embodiments, the mobile system is, e.g., a personal digital assistant (PDA), a portable computer, a web tablet, a wireless phone, a mobile phone, a digital music player, or a memory card. The controller 710 controls an execution program in the system 700 and may include, e.g., a microprocessor, a digital signal processor, a microcontroller, or the like. The input/output device 720 may be used in inputting or outputting data from or to the system 700. The system 700 may be connected to an external device, e.g., a personal computer (PC) or a network, by using the input/output device 720 and may exchange data with the external device. The input/output device 720 may be, e.g., a keypad, a keyboard, or a display.

The memory device 730 may store a code and/or data for an operation of the controller 710 or may store data processed by the controller 710. The memory device 730 may include a magnetic device that is manufactured by a method of manufacturing a magnetic device, according to at least one embodiment of the inventive concept.

The interface 740 may be a data transmission path between the system 700 and another external device (not shown). The controller 710, the input/output device 720, the memory device 730, and the interface 740 may communicate with each other via a bus 750. The system 700 may be used in, e.g., a mobile phone, an MP3 player, a navigation device, a portable multimedia player (PMP), a solid state disk (SSD), or household appliances.

Figure 20:
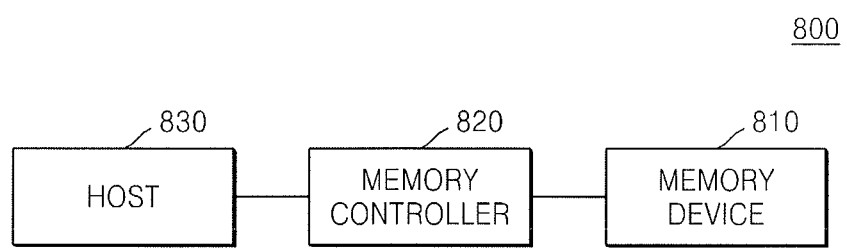
FIG. 20 illustrates a memory card that may be implemented by using a method of manufacturing a magnetic device, according to an embodiment of the inventive concept.

FIG. 20 illustrates a memory card 800 that may be implemented by using a method of manufacturing a magnetic device according to an embodiment of the inventive concept. Referring to FIG. 20, the memory card 800 may include a memory device 810 and a memory controller 820.

The memory device 810 may store data. In some embodiments, the memory device 810 has non-volatile characteristics that stored data may be retained even when a supply of power stops. The memory device 810 includes a magnetic device that is manufactured by a method of manufacturing a magnetic device, according to at least one embodiment of the inventive concept.

The memory controller 820 may read stored data from the memory device 810 or may store data in the memory device 810 in response to a read/write request of a host 830.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A magnetic device, comprising:
   at least one magnetic resistive device on a substrate, the magnetic resistive device having sidewalls with a substantially vertical profile and layers stacked in a vertical direction,
   wherein a height of the at least one magnetic resistive device is at least 1.5 times a width of the at least one magnetic resistive device.

2. The magnetic device as claimed in claim 1, wherein:
   the at least one magnetic resistive device includes a lower electrode, a magnetic structure, and an upper electrode, which are sequentially stacked in a vertical direction, and
   each of the lower electrode, the magnetic structure, and the upper electrode has sidewalls with a substantially vertical profile.

3. The magnetic device as claimed in claim 2, wherein:
   the magnetic structure includes a non-volatile metal, and
   entire sidewalls of each of the lower electrode, the magnetic structure, and the upper electrode extend along a normal to the substrate.

4. The magnetic device as claimed in claim 2, wherein the magnetic structure includes a lower magnetic layer pattern, a tunneling barrier layer, and an upper magnetic layer pattern, which are sequentially stacked in the vertical direction.

5. The magnetic device as claimed in claim 2, wherein the magnetic structure includes at least one of Co/Pd, Co/Pt, Co/Ni, Fe/Pd, Fe/Pt, MgO, PtMn, IrMn, a CoFe alloy, and a CoFeB alloy.

6. The magnetic device as claimed in claim 1, wherein the height of the at least one magnetic resistive device is about 1.5 to about 4 times the width of the at least one magnetic resistive device.

7. The magnetic device as claimed in claim 1, wherein the at least one magnetic resistive device includes at least one of Co/Pd, Co/Pt, Co/Ni, Fe/Pd, and Fe/Pt.

8. The magnetic device as claimed in claim 1, wherein the at least one magnetic resistive device includes a synthetic anti-ferromagnet structure.

9. The magnetic device as claimed in claim 1, wherein the sidewalls of the entire magnetic resistive device have a vertical profile, the sidewall including no etching residuals thereon.

10. The magnetic device as claimed in claim 3, wherein the magnetic structure includes no non-volatile metal re-deposits on the vertical sidewalls of the non-volatile metal in the magnetic structure.

11. A method of manufacturing a magnetic device, the method comprising:
    forming a stack structure, the stack structure including a magnetic resistive device with a non-volatile metal layer, the magnetic resistive device having sidewalls with a substantially vertical profile and layers stacked in a vertical direction; and
    etching the stack structure, including the non-volatile metal layer, with an etching gas including at least 80% by volume of $H_2$ gas,
    wherein a height of the at least one magnetic resistive device is at least 1.5 times a width of the at least one magnetic resistive device.

12. The method as claimed in claim 11, wherein etching the stack structure includes using an etching gas including the $H_2$ gas and an additional gas including an inert gas and/or $NH_3$ gas.

13. The method as claimed in claim 11, wherein etching the stack structure includes performing a plasma etching process.

14. The method as claimed in claim 13, further comprising, before etching the stack structure, exposing a region of the stack structure to hydrogen plasma.

* * * * *